(12) United States Patent
Inagaki et al.

(10) Patent No.: US 8,827,621 B2
(45) Date of Patent: Sep. 9, 2014

(54) SUBSTRATE PROCESSING APPARATUS, STORAGE DEVICE, AND METHOD OF TRANSPORTING SUBSTRATE STORING CONTAINER

(75) Inventors: Yukihiko Inagaki, Kyoto (JP); Kensaku Onishi, Kyoto (JP); Jun Yamamoto, Kyoto (JP)

(73) Assignee: Sokudo Co., Ltd. (JP)

( * ) Notice: Subject to any disclaimer, the term of this patent is extended or adjusted under 35 U.S.C. 154(b) by 498 days.

(21) Appl. No.: 13/042,742

(22) Filed: Mar. 8, 2011

(65) Prior Publication Data

US 2011/0222994 A1 Sep. 15, 2011

(30) Foreign Application Priority Data

Mar. 10, 2010 (JP) ................................ 2010-052900

(51) Int. Cl.
*B65G 65/00* (2006.01)
(52) U.S. Cl.
USPC .......................................... 414/282; 414/940
(58) Field of Classification Search
USPC .......... 414/277, 222.07, 222.13, 217, 222.09, 414/222.12, 591, 940, 935, 560, 561, 458, 414/282, 226.01, 226.05, 266, 279, 281; 901/1
See application file for complete search history.

(56) References Cited

U.S. PATENT DOCUMENTS 5,174,708 A * 12/1992 Ruder et al. .................. 414/392
5,564,889 A   10/1996 Araki
5,849,602 A * 12/1998 Okamura et al. ................. 438/5
5,963,753 A * 10/1999 Ohtani et al. .................. 396/611
5,989,346 A * 11/1999 Hiroki ........................... 118/719
6,066,210 A *  5/2000 Yonemitsu et al. ........... 118/719
6,143,083 A * 11/2000 Yonemitsu et al. ........... 118/719
6,729,823 B2 * 5/2004 Sakata et al. .................. 414/217
6,742,977 B1   6/2004 Okayama et al.
7,360,981 B2 * 4/2008 Weaver .......................... 414/217
7,379,785 B2 * 5/2008 Higashi et al. ................ 700/112
7,563,043 B2 * 7/2009 Kaneko et al. ................ 396/611
7,575,407 B2 * 8/2009 Tsujimoto ..................... 414/279

(Continued)

FOREIGN PATENT DOCUMENTS

JP    49-124781    11/1974
JP    51-135384    11/1976

(Continued)

OTHER PUBLICATIONS

Korean Application 10-2011-0018412 Office Action dated Nov. 2, 2012.

(Continued)

*Primary Examiner* — Saul Rodriguez
*Assistant Examiner* — Glenn Myers
(74) *Attorney, Agent, or Firm* — Ostrolenk Faber LLP

(57) ABSTRACT

In a substrate processing apparatus, a storage device, an indexer block, a processing block and an interface block are arranged to line up in this order. The storage device includes a plurality of openers on which a carrier storing a plurality of substrates can be placed. The carrier is carried in the storage device. In the storage device, the carrier is transported among the plurality of openers by a transport device. The transport device includes first and second hands configured to be able to hold the carrier and move in a horizontal direction and a vertical direction. The second hand is provided below the first hand.

2 Claims, 13 Drawing Sheets

(56) References Cited

U.S. PATENT DOCUMENTS

| | | | |
|---|---|---|---|
| 7,637,707 B2* | 12/2009 | Perlov et al. | 414/222.01 |
| 7,651,306 B2* | 1/2010 | Rice et al. | 414/217 |
| 7,857,570 B2* | 12/2010 | Elliott et al. | 414/217 |
| 7,887,276 B2* | 2/2011 | Natume | 414/217 |
| 7,896,648 B2* | 3/2011 | Nitadori et al. | 432/241 |
| 8,146,530 B2* | 4/2012 | Ishikawa et al. | 118/503 |
| 2001/0014267 A1 | 8/2001 | Yamaga et al. | 414/217 |
| 2002/0197145 A1* | 12/2002 | Yamamoto et al. | 414/806 |
| 2003/0031539 A1* | 2/2003 | Nulman et al. | 414/217.1 |
| 2003/0113190 A1* | 6/2003 | Bachrach | 414/217 |
| 2003/0164181 A1 | 9/2003 | Ohtani | |
| 2007/0140817 A1* | 6/2007 | Hansl | 414/277 |
| 2008/0199282 A1* | 8/2008 | Ishikawa et al. | 414/217 |
| 2009/0065460 A1 | 3/2009 | Murata et al. | |
| 2009/0081009 A1 | 3/2009 | Yamamoto et al. | |
| 2010/0003111 A1 | 1/2010 | Yeo et al. | |
| 2010/0228378 A1 | 9/2010 | Fukutomi et al. | |

FOREIGN PATENT DOCUMENTS

| | | |
|---|---|---|
| JP | 01-063137 | 4/1989 |
| JP | 7-125810 | 5/1995 |
| JP | 07-002309 | 6/1995 |
| JP | 10-98087 | 4/1998 |
| JP | 11-003927 | 1/1999 |
| JP | 11-219912 | 8/1999 |
| JP | 11-238672 | 8/1999 |
| JP | 2000-306978 | 11/2000 |
| JP | 2003-51527 | 2/2003 |
| JP | 2003-257945 | 9/2003 |
| JP | 2004-363363 | 12/2004 |
| JP | 2005-150575 | 6/2005 |
| JP | 3928902 | 3/2007 |
| JP | 4221733 | 2/2009 |
| JP | 2010-171314 | 8/2010 |
| KR | 10-0242533 | 2/2000 |
| KR | 10-2008-0055382 | 6/2008 |
| WO | WO 2008/023560 | 2/2008 |

OTHER PUBLICATIONS

Notice of Reasons for Refusal (Office Action) dated Apr. 2, 2013 for counterpart Japanese Application 2010-052900.

Japanse Office Action in counterpart Japanese Application No. 2010-052900 dated Jul. 17, 2012.

Decision to Grant a Patent (Notice of Allowance) dated Jul. 15, 2014 in the counterpart Japanese Application No. 2013-109376 (3 pages).

* cited by examiner

SUBSTRATE PROCESSING APPARATUS, STORAGE DEVICE, AND METHOD OF TRANSPORTING SUBSTRATE STORING CONTAINER

BACKGROUND OF THE INVENTION

1. Field of the Invention

The present invention relates to a substrate processing apparatus that performs processing on a substrate, a storage device and a method of transporting a substrate storing container.

2. Description of the Background Art

Substrate processing apparatuses are used to subject various substrates such as semiconductor substrates, substrates for liquid crystal displays, plasma displays, optical disks, magnetic disks, magneto-optical disks, photomasks, and other substrates to various types of processing.

A substrate storing container is used for carrying a plurality of substrates in/out of the substrate processing apparatus from/to the outside. Examples of such a substrate storing container include a FOUP (Front Opening Unified Pod). The substrate storing container is provided with an opening through which the substrates are taken out or stored, and a cover for opening/closing the opening.

An opener places the substrate storing container thereon and opens/closes the cover of the placed substrate storing container. In the substrate processing apparatus including the opener, the substrate storing container storing the substrates before processing is placed on the opener of the substrate processing apparatus, for example. In this state, the cover of the substrate storing container is opened, and the substrates before processing in the substrate storing container are taken out to the substrate processing apparatus. This causes the taken out substrates to be subjected to given processing. Then, the substrates after the processing by the substrate processing apparatus are stored in the empty substrate storing container. With the cover closed, the substrate storing container storing the substrates after the processing is transported from the opener to the outside of the substrate processing apparatus (JP 2003-257945 A, for example).

In recent years, processing capability of the substrate processing apparatus has been improved with an increasing number of stacked processing units that perform processing on substrates. This allows more substrates to be processed by the substrate processing apparatus per unit time, thus requiring more substrates to be taken out from the substrate storing container to the substrate processing apparatus. The number of substrates to be stored from the substrate processing apparatus to the substrate storing container per unit time also needs to be increased. Therefore, the number of openers on which the substrate storing container is to be placed is preferably increased according to improved processing capability of the substrate processing apparatus.

However, the limited number of openers can be mounted because of footprint constraints. Therefore, the throughput of the substrate processing apparatus may be limited due to exchange time of substrate storing containers.

BRIEF SUMMARY OF THE INVENTION

An object of the present invention is to provide a substrate processing apparatus, a storage device and a method of transporting a substrate storing container capable of sufficiently improving throughput of substrate processing while suppressing an increase in size.

(1) According to an aspect of the present invention, a substrate processing apparatus arranged to perform given processing on a substrate includes a storage device in and from which a substrate storing container storing a plurality of substrates is carried, and a main body arranged to take out the substrates from the substrate storing container carried in the storage device, perform the given processing on the taken out substrates, and store the substrates after the processing in the substrate storing container, wherein the storage device includes a plurality of platforms on which the substrate storing container is to be placed, and a transport device arranged to transport the substrate storing container among the plurality of platforms, the transport device includes first and second holders configured to be able to hold the substrate storing container and move among the plurality of platforms, and the second holder is provided below the first holder.

In the substrate processing apparatus, the substrate storing container storing the substrates before the processing is carried in the storage device. When the substrate storing container is carried in the storage device, the main body takes out the substrates stored in the substrate storing container and performs the given processing on the taken out substrates. The substrates after the processing are stored in the substrate storing container by the main body. The substrate storing container storing the substrates after the processing is carried out from the storage device.

The substrate storing container is to be placed on the plurality of platforms in the storage device. The substrate storing container is transported by the transport device among the plurality of platforms.

The transport device includes the first and second holders. Thus, with one substrate storing container placed on any one of the platforms, one of the first and second holders can hold another substrate storing container and cause the another substrate storing container to wait at a position opposite to the one platform.

In this state, when the one substrate storing container placed on the one platform is ready to be transported, the one substrate storing container can be held and taken out from the one platform by the other one of the first and second holders, and the another substrate storing container can be quickly placed on the one platform by the one holder.

In this manner, time for exchanging the substrate storing containers on each of the platforms is sufficiently shortened. Thus, providing the minimum number of platforms improves throughput of substrate processing.

The second holder is provided below the first holder in the transport device. This causes the structure including the first and second holders to be made compact.

Accordingly, the throughput of the substrate processing can be sufficiently improved while an increase in size of the substrate processing apparatus can be suppressed.

(2) The first and second holders may be configured to be able to move independently from each other.

In this case, taking out the substrate storing container from the platform, placing the substrate storing container on the platform and transporting the substrate storing container can be concurrently performed. This shortens time for transporting the substrate storing containers in the storage device.

(3) The plurality of platforms may be arranged to line up in a horizontal direction, and the transport device may further include a horizontal moving mechanism arranged to move the first and second holders along a direction in which the plurality of platforms line up, and a vertical moving mechanism arranged to move the first and second holders independently from each other in a vertical direction.

In this case, the horizontal moving mechanism moves the first and second holders in the direction in which the plurality of platforms line up. The vertical moving mechanism moves the first and second holders independently from each other in the vertical direction.

Accordingly, the substrate storing container placed on one of the platforms can be taken out from the platform by one of the first and second holders, the taken out substrate storing container can be transported to another platform, and the substrate storing container held by the other one of the first and second holders can be placed on the one of platforms with simple configuration.

The first and second holders can be moved relative to each other in the vertical direction, so that the first and second holders can be brought close to or separated from each other. Thus, a limited space in the vertical direction in the substrate processing apparatus can be efficiently utilized.

(4) The vertical moving mechanism may include a support body arranged to support the first and second holders such that the first and second holders can move in the vertical direction, a support body vertical moving mechanism arranged to move the support body in the vertical direction, and first and second holder moving mechanisms arranged to move the first and second holders, respectively, relative to the support body in the vertical direction, and the horizontal moving mechanism may move the support body along the direction in which the plurality of platforms line up.

In this case, the support body can be moved in the vertical direction by the vertical moving mechanism, and the first and second holders can be moved in the vertical direction by the first and second holder moving mechanisms. This improves the moving speed of the first and second holders in the vertical direction. As a result, the time for transporting the substrate storing containers in the storage device can be sufficiently shortened.

In addition, the horizontal moving mechanism moves the support body along the direction in which the plurality of platforms line up. This allows the first and second holders to simultaneously move along the direction in which the plurality of platforms line up.

(5) The support body may include first and second support members provided at a distance from each other in the horizontal direction and provided to extend in the vertical direction, the first holder moving mechanism may move the first holder along the first support member, the second holder moving mechanism may move the second holder along the second support member, and the first and second holders may be configured to be able to advance/retreat between a position sandwiched by the first and second support members and each of positions of the plurality of platforms.

In this case, the first and second holder moving mechanisms move the first and second holders in the vertical direction along the first and second support members, respectively. This allows the first and second holders to move in the vertical direction with simple configuration.

The first and second holders advance/retreat between the position sandwiched by the first and second support members and each of the positions of the plurality of platforms. Thus, the substrate storing container placed on any of the platforms can be taken out from the platform by one of the first and second holders, and the substrate storing container held by the other one of the first and second holders can be placed on the platform with simple operation. Accordingly, the configurations and operations of the first and second support members can be simplified.

(6) According to another aspect of the present invention, a storage device includes a plurality of platforms on which a substrate storing container that can store a plurality of substrates is to be placed, and a transport device arranged to transport the substrate storing container among the plurality of platforms, wherein the transport device includes first and second holders configured to be able to hold the substrate storing container and move among the plurality of platforms, and the second holder is provided below the first holder.

The substrate storing container is to be placed on the plurality of platforms in the storage device. The substrate storing container is transported by the transport device among the plurality of platforms.

The transport device includes the first and second holders. Thus, with one substrate storing container placed on any one of the platforms, one of the first and second holders can hold another substrate storing container and cause the another substrate storing container to wait at a position opposite to the one platform.

In this state, when the one substrate storing container placed on the one platform is ready to be transported, the one substrate storing container can be held and taken out from the one platform by the other one of the first and second holders, and the another substrate storing container can be quickly placed on the one platform by the one holder.

In this manner, the time for exchanging the substrate storing containers on each of the platforms is sufficiently shortened. Thus, providing the minimum number of platforms shortens the time for transporting the substrate storing containers in the storage device.

The second holder is provided below the first holder in the transport device. This causes the structure including the first and second holders to be made compact.

Accordingly, the time for transporting the substrates can be shortened while an increase in size of the storage device can be suppressed. Thus, the throughput of the substrate processing can be sufficiently improved by providing the storage device in the substrate processing apparatus.

(7) The first and second holders may be configured to be able to move independently from each other.

In this case, taking out the substrate storing container from the platform, placing the substrate storing container on the platform and transporting the substrate storing container can be concurrently performed. This shortens the time for transporting the substrate storing containers in the storage device.

(8) The plurality of platforms may be arranged to line up in a horizontal direction, and the transport device may further include a horizontal moving mechanism arranged to move the first and second holders along a direction in which the plurality of platforms line up, and a vertical moving mechanism arranged to move the first and second holders independently from each other in a vertical direction.

In this case, the horizontal moving mechanism moves the first and second holders in the direction in which the plurality of platforms line up. The vertical moving mechanism moves the first and second holders independently from each other in the vertical direction.

Accordingly, the substrate storing container placed on one of the platforms can be taken out from the platform using one of the first and second holders, the taken out substrate storing container can be transported to another platform, and the substrate storing container held by the other one of the first and second holders can be placed on the one of the platforms with simple configuration.

The first and second holders can be moved relative to each other in the vertical direction, so that the first and second holders can be brought close to or separated from each other. Thus, a limited space in the vertical direction in the storage device can be efficiently utilized.

(9) The vertical moving mechanism may include a support body arranged to support the first and second holders such that the first and second holders can move in the vertical direction, a support body vertical moving mechanism arranged to move the support body in the vertical direction, and first and second holder moving mechanisms arranged to move the first and second holders, respectively, relative to the support body in the vertical direction, and the horizontal moving mechanism may move the support body along the direction in which the plurality of platforms line up.

In this case, the support body can be moved in the vertical direction by the vertical moving mechanism, and the first and second holders can be moved in the vertical direction by the first and second holder moving mechanisms. This improves the moving speed of the first and second holders in the vertical direction. As a result, the time for transporting the substrate storing container in the storage device can be sufficiently shortened.

In addition, the horizontal moving mechanism moves the support body along the direction in which the plurality of platforms line up. This allows the first and second holders to simultaneously move along the direction in which the plurality of platforms line up.

(10) The support body may include first and second support members provided at a distance from each other in the horizontal direction and provided to extend in the vertical direction, the first holder moving mechanism may move the first holder along the first support member, the second holder moving mechanism may move the second holder along the second support member, and the first and second holders may be configured to be able to advance/retreat between a position sandwiched by the first and second support members and each of positions of the plurality of platforms.

In this case, the first and second holder moving mechanisms move the first and second holders in the vertical direction along the first and second support members, respectively. This allows the first and second holders to move in the vertical direction with simple configuration.

The first and second holders advance/retreat between the position sandwiched by the first and second support members and each of the positions of the plurality of platforms. Thus, the substrate storing container placed on any of the platforms can be taken out from the platform by one of the first and second holders, and the substrate storing container held by the other one of the first and second holders can be placed on the platform with simple operation. Accordingly, the configurations and operations of the first and second support members can be simplified.

(11) According to still another aspect of the present invention, a substrate processing apparatus arranged to perform given processing on a substrate includes a storage device in and from which a substrate storing container storing a plurality of substrates is carried, a main body arranged to take out the substrates from the substrate storing container carried in the storage device, perform the given processing on the taken out substrates, and store the substrates after the processing in the substrate storing container, and a controller arranged to control an operation of the storage device, wherein the storage device includes a plurality of platforms on which the substrate storing container is to be placed, and a transport device arranged to transport the substrate storing container among the plurality of platforms, the transport device includes first and second holders configured to be able to hold the substrate storing container and move among the plurality of platforms, and the controller controls the transport device, with one substrate storing container placed on any one of the platforms, to hold another substrate storing container using one of the first and second holders and cause the another substrate storing container to wait in a position opposite to the one platform, and when the one substrate storing container placed on the one platform is ready to be transported, to hold and take out the one substrate storing container from the one platform using the other one of the first and second holders and place the another substrate storing container on the one platform using the one holder.

In the substrate processing apparatus, the substrate storing container storing the substrates before the processing is carried in the storage device. When the substrate storing container is carried in the storage device, the main body takes out the substrates stored in the substrate storing container and performs the given processing on the taken out substrates. The substrates after the processing are stored in the substrate storing container by the main body. The substrate storing container storing the substrates after the processing is carried out from the storage device.

The substrate storing container is to be placed on the plurality of platforms in the storage device. The substrate storing container is transported by the transport device among the plurality of platforms.

With the one substrate storing container placed on any one of the platforms, the one of the first and second holders holds the another substrate storing container and causes the held another substrate storing container to wait at the position opposite to the one platform.

When the one substrate storing container placed on the one platform is ready to be transported, the one substrate storing container is held and taken out from the one platform by the other one of the first and second holders, and the another substrate storing container held by the one holder is quickly placed on the one platform.

In this manner, the time for exchanging the substrate storing containers on each of the platforms is sufficiently shortened. Accordingly, providing the minimum number of platforms improves throughput of substrate processing.

Accordingly, the throughput of the substrate processing can be sufficiently improved while an increase in size of the substrate processing apparatus can be suppressed.

(12) The controller may determine whether or not an abnormality occurs in the first or second holder, and control the transport device, when the abnormality occurs in one of the first and second holders, to stop an operation of the one holder, and place the substrate storing container on each of the platforms, take the substrate storing container out from each of the platforms, and transport the substrate storing container among the plurality of platforms using the other holder.

In this case, even though the abnormality occurs in any one of the first and second holders, placing the substrate storing container on each of the platforms, taking the substrate storing container out from each of the platforms and transporting the substrate storing container among the plurality of platforms can be continued using the other holder that is normal. This prevents a significant decrease in production efficiency of the substrate processing apparatus.

(13) According to yet another aspect of the present invention, a storage device includes a plurality of platforms on which a substrate storing container that can store a plurality of substrates is to be placed, and a transport device arranged to transport the substrate storing container among the plurality of platforms, wherein the transport device includes first and second holders configured to be able to hold the substrate storing container and move among the plurality of platforms, and a controller, and the controller controls the transport device, with one substrate storing container placed on any one of the platforms, to hold another substrate storing container using one of the first and second holders and cause the another substrate storing container to wait in a position opposite to the one platform, and when the one substrate storing container placed on the one platform is ready to be transported, to hold and take out the one substrate storing container from the one platform using the other one of the first and second holders and place the another substrate storing container on the one platform using the one holder.

The substrate storing container is to be placed on the plurality of platforms in the storage device. The substrate storing container is transported by the transport device among the plurality of platforms.

With the one substrate storing container placed on any one of the platforms, the one of the first and second holders holds the another substrate storing container and causes the held another substrate storing container to wait at the position opposite to the one platform.

When the one substrate storing container placed on the one platform is ready to be transported, the one substrate storing container is held and taken out from the one platform by the other one of the first and second holders, and the another substrate storing container held by the one holder is quickly placed on the one platform.

In this manner, the time for exchanging the substrate storing containers on each of the platforms is sufficiently shortened. Thus, providing the minimum number of platforms shortens the time for transporting the substrate storing containers in the storage device.

Accordingly, the time for transporting the substrates can be shortened while an increase in size of the storage device can be suppressed. Thus, the throughput of the substrate processing can be sufficiently improved by providing the storage device in the substrate processing apparatus.

(14) The controller may determine whether or not an abnormality occurs in the first or second holder, and control the transport device, when the abnormality occurs in one of the first and second holders, to stop an operation of the one holder, and place the substrate storing container on each of the platforms, take the substrate storing container out from each of the platforms, and transport the substrate storing container among the plurality of platforms using the other holder.

In this case, even though the abnormality occurs in any one of the first and second holders, placing the substrate storing container on each of the platforms, taking the substrate storing container out from each of the platforms and transporting the substrate storing container among the plurality of platforms can be continued using the other holder that is normal. As a result, a significant decrease in production efficiency of the substrate processing apparatus is prevented by providing the storage device in the substrate processing apparatus.

(15) According to still another aspect of the present invention, a method of transporting a substrate storing container that can store a plurality of substrates includes the step of transporting the substrate storing container among a plurality of platforms on which the substrate storing container is to be placed using first and second holders, wherein the first and second holders are configured to be able to hold the substrate storing container and move among the plurality of platforms, the step of transporting the substrate storing container includes the steps of, with one substrate storing container placed on any one of the platforms, holding another substrate storing container using one of the first and second holders and causing the another substrate storing container to wait in a position opposite to the one platform, and when the one substrate storing container placed on the one platform is ready to be transported, holding and taking out the one substrate storing container from the one platform using the other one of the first and second holders, and placing the another substrate storing container on the one platform using the one holder.

In the method of transporting the substrate storing container, the substrate storing container is to be placed on the plurality of platforms. The substrate storing container is transported by the first and second holders among the plurality of platforms.

With the one substrate storing container placed on any one of the platforms, the one of the first and second holders holds the another substrate storing container and causes the held another substrate storing container to wait at the position opposite to the one platform.

When the one substrate storing container placed on the one platform is ready to be transported, the one substrate storing container is held and taken out from the one platform by the other one of the first and second holders, and the another substrate storing container held by the one holder is quickly placed on the one platform.

In this manner, the time for exchanging the substrate storing containers on each of the platforms is sufficiently shortened. Thus, providing the minimum number of platforms shortens the time for transporting the substrate storing containers.

Accordingly, the time for transporting the substrates can be shortened while an increase in size of the configuration for transporting the substrate storing containers can be suppressed. Thus, applying the transporting method to the substrate processing apparatus allows the throughput of the substrate processing to be sufficiently improved.

(16) The step of transporting the substrate storing container may further include the steps of determining whether or not an abnormality occurs in the first or second holder, and when the abnormality occurs in one of the first and second holders, stopping an operation of the one holder, and placing the substrate storing container on each of the platforms, taking the substrate storing container out from each of the platforms, and transporting the substrate storing container among the plurality of platforms using the other holder.

In this case, even though the abnormality occurs in any one of the first and second holders, placing the substrate storing container on each of the platforms, taking the substrate storing container out from each of the platforms and transporting the substrate storing container among the plurality of platforms can be continued using the other holder that is normal. As a result, a significant decrease in production efficiency of the substrate processing apparatus is prevented by applying the transporting method to the substrate processing apparatus.

Other features, elements, characteristics, and advantages of the present invention will become more apparent from the following description of preferred embodiments of the present invention with reference to the attached drawings.

DETAILED DESCRIPTION OF THE INVENTION

Figure 1:
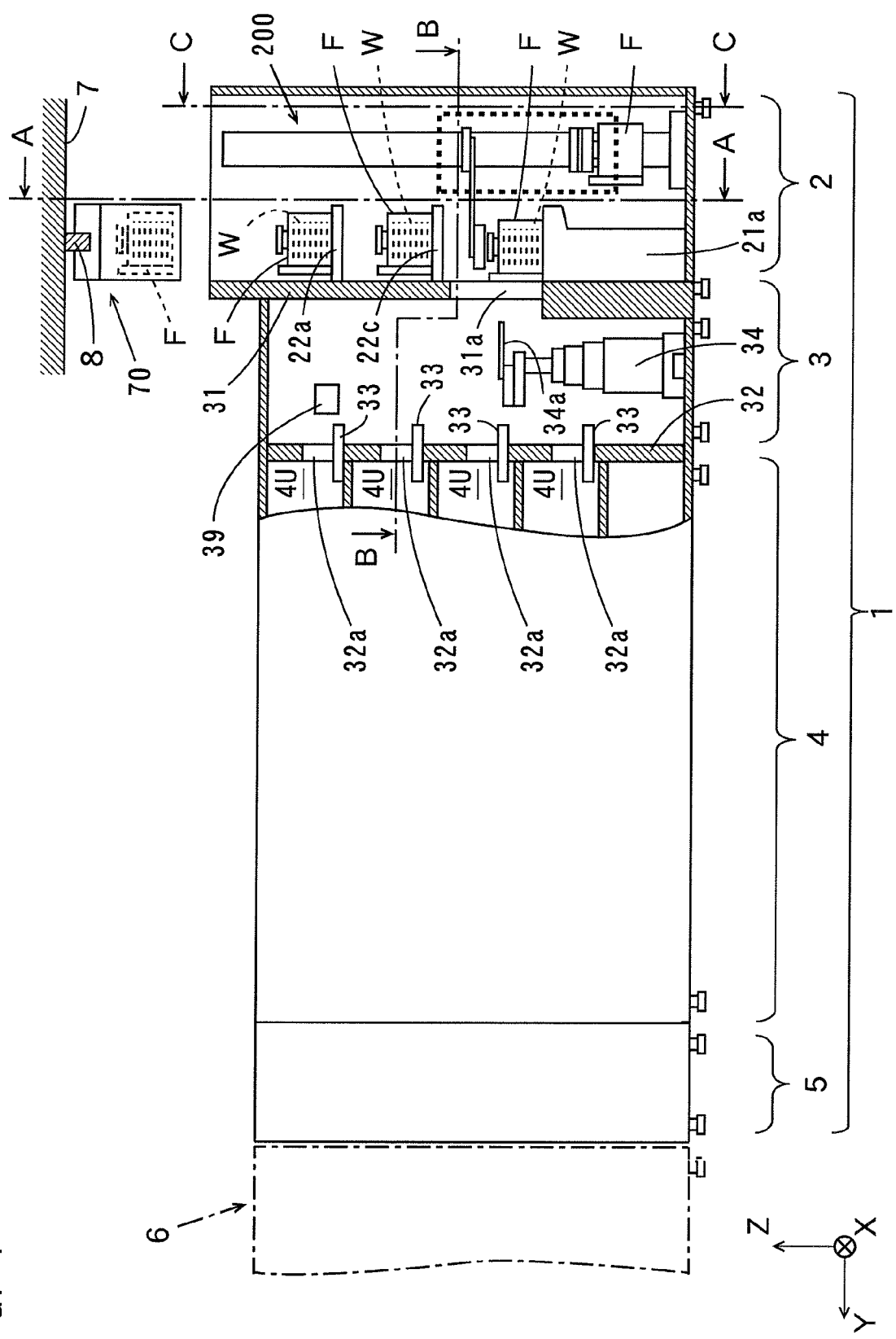
FIG. 1 is a partially cutaway sectional view of a substrate processing apparatus according to one embodiment of the present invention that is seen from one side.

Description will be made of a substrate processing apparatus, a storage device and a method of transporting a substrate storing container according to one embodiment of the present invention while referring to the drawings. In the following description, substrates refer to semiconductor substrates, substrates for liquid crystal displays, plasma displays, optical disks, magnetic disks, magneto-optical disks, photomasks, glass substrates for photomasks, and other substrates.

A carrier that stores a plurality of substrates in multiple stages is carried from outside (another substrate processing apparatus, for example) to the substrate processing apparatus according to the present embodiment. In the substrate processing apparatus, substrates before processing are taken out from the carrier that is carried in, and given processing is performed on the taken-out substrates. Then, the substrates after processing are stored in the carrier. The carrier storing the substrates after processing is carried out of the substrate processing apparatus. A FOUP (Front Opening Unified Pod) is used as the carrier in the present embodiment. The FOUP is provided with an opening through which the substrates are taken out or stored, and a cover for opening/closing the opening. The plurality of substrates can be transported while being held in an enclosed space by using the FOUP.

(1) Configuration of the Substrate Processing Apparatus

Figure 2:
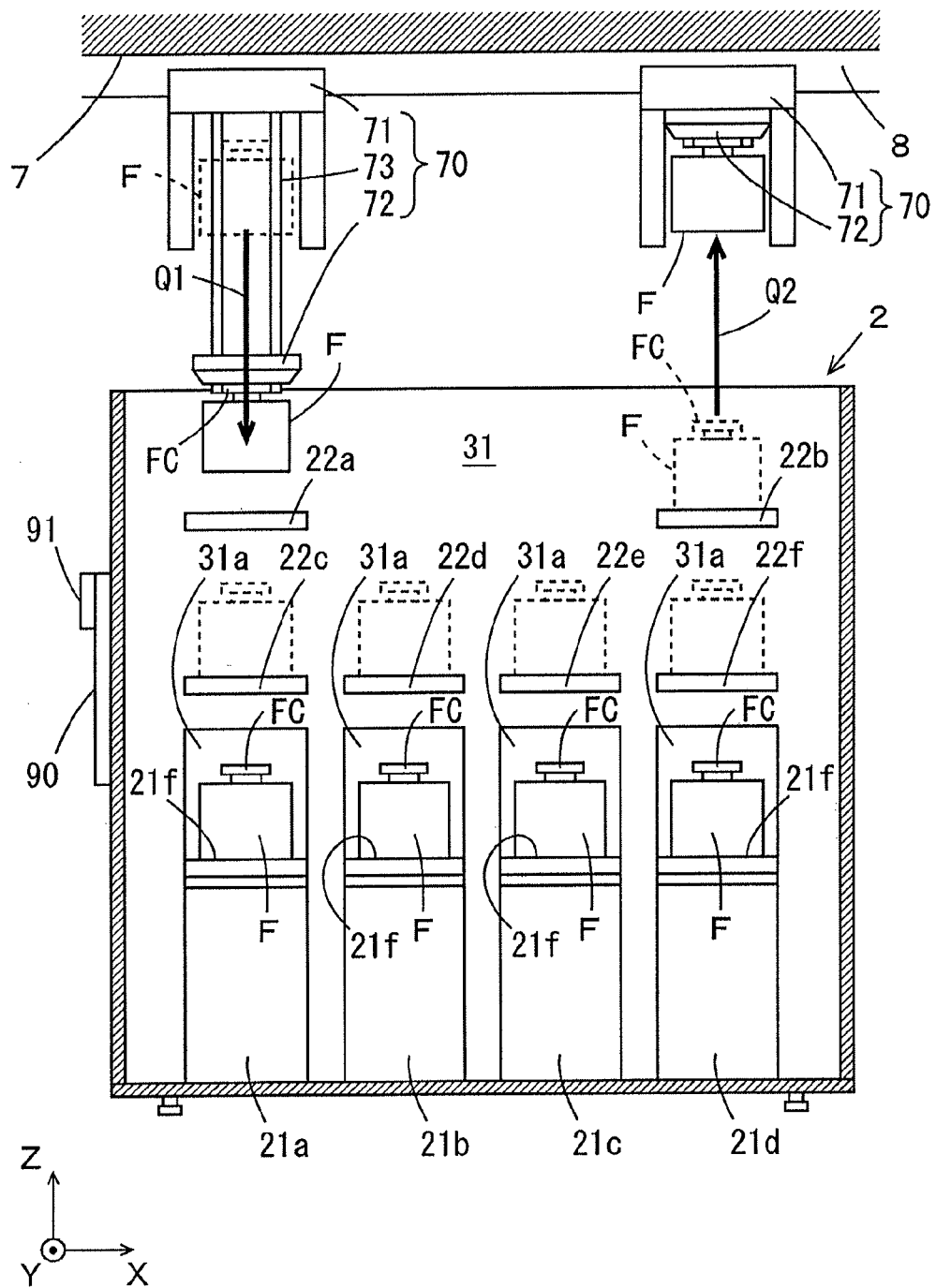
FIG. 2 is a vertical sectional view taken along the line A-A of FIG. 1.
Figure 3:
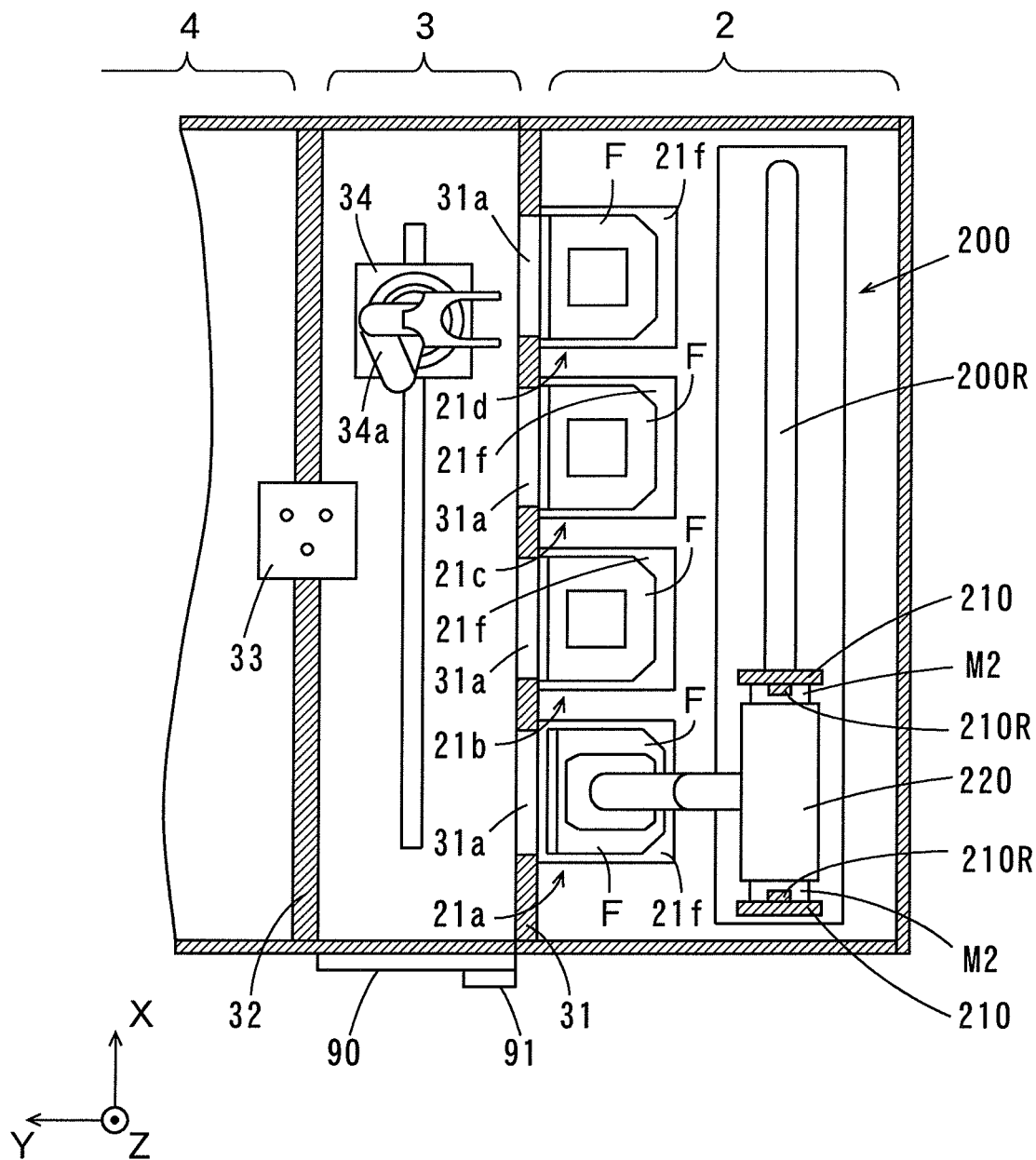
FIG. 3 is a transverse sectional view taken along the line B-B of FIG. 1.

FIG. 1 is a partially cutaway sectional view of the substrate processing apparatus according to one embodiment of the present invention that is seen from one side, FIG. 2 is a vertical sectional view taken along the line A-A of FIG. 1, and FIG. 3 is a transverse sectional view taken along the line B-B of FIG. 1. FIGS. 1 to 3, and FIGS. 4 to 8 and 11 to 13 described below are accompanied by arrows indicating an X-direction, a Y-direction and a Z-direction that are perpendicular to one another. The X-direction and the Y-direction are perpendicular to each other in a horizontal plane, and the Z-direction corresponds to a vertical direction.

As shown in FIG. 1, the substrate processing apparatus 1 includes a storage device 2, an indexer block 3, a processing block 4 and an interface block 5. The storage device 2, the indexer block 3, the processing block 4 and the interface block 5 are arranged to line up in this order along the X-direction. An exposure device 6 is arranged adjacent to the interface block 5.

The substrate processing apparatus 1 is installed in a clean room. Above the substrate processing apparatus 1, a rail 8 is attached to a ceiling 7 of the clean room. An external transport device 70 that transports the carrier F between the substrate processing apparatus 1 and the outside (another substrate processing apparatus, for example) is provided on the rail 8.

As shown in FIG. 2, the external transport device 70 has an OHT (Overhead Hoist Transport) mechanism. The external transport device 70 includes a transport vehicle 71 that transports the carrier F along the rail 8. A grip portion 72, a rope 73 and a winch (not shown) are provided in the transport vehicle 71. The grip portion 72 grips a projection FC provided in an upper portion of the carrier F. The rope 73 is used for suspending the grip portion 72 from the transport vehicle 71. The winch reels out or winds up the rope 73.

As shown in FIG. 1, a partition wall 31 for shielding an atmosphere is provided between the storage device 2 and the indexer block 3. Four openings 31a for transferring the substrates W between the storage device 2 and the indexer block 3 are formed in the partition wall 31 as shown in FIG. 2.

As shown in FIGS. 1 to 3, the storage device 2 includes a plurality of openers 21a, 21b, 21c, 21d, a receiving shelf 22a, a passing shelf 22b, a plurality of keeping shelves 22c, 22d, 22e, 22f and a transport device 200. The four openers 21a to 21d are provided on a floor surface of the storage device 2 in contact with the partition wall 31. The four openers 21a to 21d are arranged to line up at equal spacings in the X-direction and each include a platform 21f on which the carrier F is placed.

As shown in FIG. 2, the four openings 31a of the partition wall 31 are formed in respective regions higher than the platforms 21f of the four openers 21a to 21d. Each of the openers 21a to 21d includes a shutter and a shutter driving unit (not shown) that open/close the opening 31a formed in the partition wall 31. The shutter driving unit opens/closes the cover of the carrier F placed on the platform 21f as well as the shutter.

The four keeping shelves 22c, 22d, 22e, 22f are provided above the four openers 21a to 21d, respectively. The carrier F is to be placed on each of the keeping shelves 22c, 22d, 22e, 22f. The receiving shelf 22a and the passing shelf 22b are provided above the two keeping shelves 22c, 22f, respectively, at both ends in a direction in which the openers 21a to 21d are arranged (X-direction). The carrier F is to be placed on each of the receiving shelf 22a and the passing shelf 22b.

The transport device 200 (FIGS. 1 and 3) of the storage device 2 is used for transporting the carrier F among the plurality of openers 21a to 21d, the receiving shelf 22a, the passing shelf 22b and the keeping shelves 22c to 22f. Details will be described below.

As shown in FIGS. 1 and 3, the indexer block 3 includes a main controller 39 and an indexer robot 34. The main controller 39 controls operations of the storage device 2, the indexer block 3, the processing block 4 and the interface block 5. The main controller 39 is composed of a CPU (Central Processing Unit) and a memory or composed of a microcomputer, for example, and controls operations of components in the substrate processing apparatus. The indexer robot 34 is provided with a hand 34a for transferring the substrate W.

As shown in FIGS. 2 and 3, the indexer block 3 includes an operation panel 90. The operation panel 90 is provided on a side wall of the indexer block 3. The operation panel 90 outputs a command signal to the main controller 39 (FIG. 1) according to an operation by a worker. The operation panel 90 includes an alarm device 91. The alarm device 91 is an output device such as a lamp or a speaker.

The processing block 4 of FIG. 1 includes a plurality of processing units 4U and a transport robot (not shown) that transports the substrate W among the plurality of processing units 4U. The plurality of processing units 4U are stacked in a plurality of stages in the processing block 4. In the example of FIG. 1, the four processing units 4U adjacent to the indexer block 3 are stacked in four stages.

The plurality of processing units 4U of the processing block 4 include a coating processing unit for resist film that forms a resist film on the substrate W, a thermal processing unit that heats or cools the substrate W and a development processing unit that develops the substrate W after exposure.

A partition wall 32 for shielding an atmosphere (FIGS. 1 and 3) is provided between the indexer block 3 and the processing block 4. Openings 32a of the same number (four) as the number of stages of the processing units 4U in the processing block 4 are formed in the partition wall 32. A substrate platform 33 is provided in each of the openings 32a of the partition wall 32. The openings 32a and the substrate platforms 33 are used for transferring the substrates W between the indexer block 3 and the processing block 4.

The interface block 5 includes a transport robot (not shown) that transfers the substrates W between the substrate processing apparatus 1 and the exposure device 6.

(2) Operation of the Substrate Processing Apparatus (2-a) Schematic Description of Operation of the Substrate Processing Apparatus Schematic description will be made of a series of operations in the substrate processing apparatus 1 while mainly referring to FIG. 2. First, the carrier F storing the substrates W before processing is placed on the receiving shelf 22a of the storage device 2 (a carrier carrying-in step).

Next, the carrier F placed on the receiving shelf 22a is transported in the storage device 2, and placed on any of the platforms 21f of the openers 21a, 21b (a first carrier transporting step). When the carrier F cannot be placed on any of the platforms 21f of the openers 21a, 21b, the carrier F is placed on the keeping shelf 22c.

Then, the substrates W before processing are taken out from the carrier F placed on any of the platforms 21f of the openers 21a, 21b by the indexer robot 34 of FIG. 3 (a substrate taking-out step).

In the foregoing substrate taking-out step, the substrates W are taken out from the carrier F by repetitive taking-out operations, so that the carrier F becomes empty. The empty carrier F is transported in the storage device 2, and placed on any of the platforms 21f of the openers 21c, 21d (a second carrier transporting step). When the carrier F cannot be placed on any of the platforms 21f of the openers 21c, 21d, the carrier F is placed on any of the keeping shelves 22d, 22e.

The substrates W taken out from the carrier F in the substrate taking-out step are transported to the processing block 4 and the exposure device 6 of FIG. 1, and subjected to the given processing (a substrate processing step).

The substrates W after processing are transported and stored in the empty carrier F placed on any of the platforms 21f of the openers 21c, 21d by the indexer robot 34 of FIG. 3 (a substrate storing step).

When a given number of substrates W after processing is stored in the empty carrier F placed on any of the platforms 21f (FIGS. 2 and 3) of the openers 21c, 21d, the carrier F storing the substrates W after processing is transported to be placed on the passing shelf 22b (a third carrier transporting step). When the carrier F cannot be placed on the passing shelf 22b, the carrier F is placed on the keeping shelf 22f. Finally, the carrier F placed on the passing shelf 22b is carried out to the outside (a carrier carrying-out step). Details of each of the foregoing steps will be described below.

(2-b) The Carrier Carrying-in Step

As shown in FIGS. 1 and 2, an upper portion of the storage device 2 is opened. The carrier F is carried in the substrate processing apparatus 1 as follows. First, the carrier F storing the substrates W before processing is transported by the external transport device 70, and stopped at a position above the receiving shelf 22a.

Next, as shown in FIG. 2, the winch of the transport vehicle 71 operates to reel out the rope 73, and the carrier F gripped by the grip portion 72 is lowered to be placed on the receiving shelf 22a of the storage device 2 (see the arrow Q1 of FIG. 2). Then, a state where the projection FC is gripped by the grip portion 72 is released, and the winch operates to wind up the rope 73. Thus, the grip portion 72 is raised to be stored in the transport vehicle 71.

(2-c) The First Carrier Transporting Step

In the first carrier transporting step, the carrier F placed on the receiving shelf 22a in the storage device 2 is transported by the transport device 200 (FIGS. 1 and 3), and placed on any of the platforms 21f (FIGS. 2 and 3) of the two openers 21a, 21b. When the carrier F cannot be placed on any of the platforms 21f of the openers 21a, 21b, the carrier F is placed on the keeping shelf 22c (FIG. 2).

(2-d) The Substrate Taking-Out Step

The covers of the carriers F placed on the platforms 21f and the shutters of the openings 31a (FIGS. 2 and 3) are opened by the two openers 21a, 21b (FIGS. 2 and 3).

The substrates W before processing are taken out from the carrier F by the indexer robot 34 (FIGS. 1 and 3) of the indexer block 3, and transported to any of the plurality of substrate platforms 33 provided in the partition wall 32 (FIGS. 1 and 3). In this manner, the substrates W before processing are taken out from the carrier F carried in the substrate processing apparatus 1 to the processing block 4 (FIGS. 1 and 3).

(2-e) The Second Carrier Transporting Step

When the carrier F becomes empty after repetitive taking-out operation, the empty carrier F is transported by the transport device 200 (FIGS. 1 and 3), and placed on any of the platforms 21f (FIGS. 2 and 3) of the two openers 21c, 21d of FIG. 2. When the carrier F cannot be placed on any of the openers 21c, 21d, the carrier F is placed on any of the keeping shelves 22d, 22e (FIGS. 2 and 3).

(2-f) Substrate Processing Step

In the processing block 4 (FIGS. 1 and 3), the substrates W before processing placed on the substrate platforms 33 (FIGS. 1 and 3) are transported to any of the plurality of processing units 4U by the transport robot. Thus, the substrates W before processing transported from the indexer block 3 are subjected to coating processing of a photo resist, thermal processing and so on.

The substrates W are transported to the exposure device 6 (FIG. 1) via the interface block 5 (FIG. 1) by the transport robot. In the exposure device 6, the substrates W transported from the interface block 5 are subjected to exposure processing. The substrates W subjected to the exposure processing are again transported to the processing block 4 via the interface block 5.

In the processing block 4, the substrates W after the exposure processing are subjected to development processing, thermal processing and so on. The substrates W subjected to the foregoing series of processing (coating processing, exposure processing, development processing, thermal processing and so on) are transported by the transport robot, and again placed on the substrate platforms 33. Then, the substrates W are received by the indexer robot 34 (FIGS. 1 and 3) of the indexer block 3.

(2-g) The Substrate Storing Step

As described above, the empty carrier F after the substrates W before processing are taken out is placed on at least one of the platforms 21f (FIGS. 2 and 3) of the two openers 21c, 21d of the storage device 2. In this state, the cover of the carrier F and the shutter of the opening 31a (FIGS. 2 and 3) are opened. Thus, the substrates W after processing are transported to the empty carrier F by the indexer robot 34. In this manner, the substrates W after processing by the processing block 4 and the exposure device 6 are stored in the empty carrier F.

(2-h) The Third Carrier Transporting Step

When the given number of substrates W after processing is stored in the empty carriers F placed on one of the platforms 21f (FIGS. 2 and 3) of the openers 21c, 21d, the cover of the carriers F and the shutter of the opening 31a (FIGS. 2 and 3) are closed.

Then, the carrier F storing the substrates W after processing is transported by the transport device 200 of FIG. 3, and placed on the passing shelf 22b (FIG. 2). When the carrier F cannot be placed on the passing shelf 22b, the carrier F is placed on the keeping shelf 22f (FIG. 2).

(2-i) The Carrier Carrying-Out Step

The external transport device 70 (FIG. 2) waits at a position above the passing shelf 22b (FIG. 2). As shown in FIG. 2, when the carrier F is placed on the passing shelf 22b, the winch of the transport vehicle 71 operates to reel out the rope 73. Thus, when the grip portion 72 is lowered to reach the upper portion of the carrier F, the projection FC of the carrier F is gripped by the grip portion 72. In this state, the winch operates to wind up the rope 73. Accordingly, the grip portion 72 is raised to cause the carrier F to be stored in the transport vehicle 71 (see the arrow Q2 of FIG. 2). Then, the external transport device 70 moves, thereby transporting the carrier F storing the substrates W after processing to the outside of the substrate processing apparatus 1.

(3) Details of the Transport Device Included in the Storage Device

Figure 4:
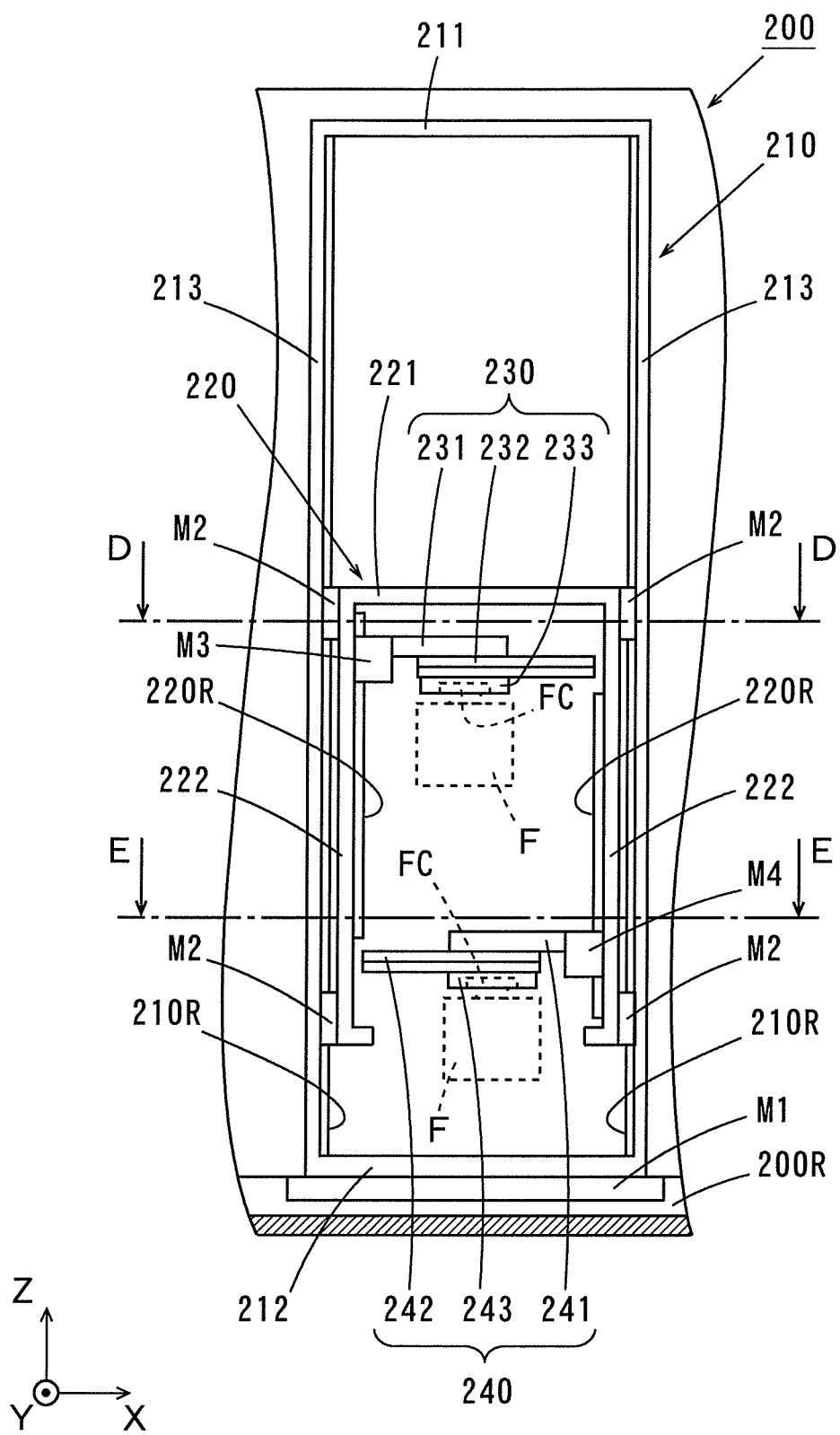
FIG. 4 is a partially enlarged vertical sectional view taken along the line C-C of FIG. 1.

FIG. 4 is a partially enlarged vertical sectional view taken along the line C-C of FIG. 1. FIG. 4 is shows the transport device 200 in an enlarged manner. As shown in FIGS. 3 and 4, the transport device 200 includes a first transport frame 210, a second transport frame 220, a first hand 230, a second hand 240, a first moving mechanism M1, second moving mechanisms M2, a third moving mechanism M3 and a fourth moving mechanism M4 as main constituents.

As shown in FIG. 3, a rail 200R is mounted on the floor surface of the storage device 2 in front of the plurality of openers 21a to 21d so as to extend along the direction in which the openers 21a to 21d are arranged (X-direction).

As shown in FIG. 4, the first moving mechanism M1 is provided on the rail 200R. The first transport frame 210 is provided on the first moving mechanism M1. The first transport frame 210 includes a top plate 211, a bottom plate 212 and a pair of side plates 213 that are opposite to each other. The first moving mechanism M1 includes a motor, for example. The motor operates to cause the first moving mechanism M1 to move on the rail 200R. Thus, the first transport frame 210 as well as the first moving mechanism M1 is movable in the direction in which the openers 21a to 21d of FIG. 3 are arranged (X-direction).

A pair of rails 210R is mounted on the inside of the pair of side plates 213 from the top plate 211 to the bottom plate 212 so as to extend in the vertical direction (Z-direction). The two second moving mechanisms M2 are provided on the inside of each of the rails 210R.

The second transport frame 220 is supported by the plurality of second moving mechanisms M2 within the first transport frame 210. The second transport frame 220 includes a top plate 221 and a pair of side plates 222 that are opposite to each other. A bottom portion of the second transport frame 220 is opened. Portions in the vicinity of upper ends and lower ends of the side plates 222 are connected to the second moving mechanisms M2, respectively. The second moving mechanisms M2 include motors, for example. The motor operates to cause the second moving mechanism M2 to move on the rail 210R. Thus, the second transport frame 220 as well as the second moving mechanisms M2 is movable in the vertical direction (Z-direction) within the first transport frame 210.

A pair of rails 220R is mounted on the inside of the pair of side plates 222 so as to extend in the vertical direction (Z-direction). The third moving mechanism M3 and the fourth moving mechanism M4 are provided on the inside of the pair of rails 220R, respectively.

The first hand 230 is supported by the third moving mechanism M3 within the second transport frame 220. The first hand 230 includes a support plate 231, a multi-joint arm 232 and a grip portion 233. The support plate 231 is connected to the third moving mechanism M3. The third moving mechanism M3 includes a motor, for example. The motor operates to cause the third moving mechanism M3 to move on the rail 220R. Thus, the first hand 230 as well as the third moving mechanism M3 is movable in the vertical direction (Z-direction) within the second transport frame 220.

Similarly, the second hand 240 is supported by the fourth moving mechanism M4 within the second transport frame 220. The second hand 240 is positioned below the first hand 230, and includes a support plate 241, a multi-joint arm 242 and a grip portion 243. The support plate 241 is connected to the fourth moving mechanism M4. Thus, the second hand 240 as well as the fourth moving mechanism M4 is movable in the vertical direction (Z-direction) within the second transport frame 220.

The first and second hands 230, 240 are supported within the second transport frame 220 via the third and fourth moving mechanisms M3, M4, respectively. Therefore, the first and second hands 230, 240 are movable relative to each other in the vertical direction (Z-direction) within the second transport frame 220.

In this manner, in the storage device 2, the first, second and third moving mechanisms M1, M2, M3 cause the first hand 230 to move in the vertical direction (Z-direction) and the direction in which the openers 21a to 21d (FIG. 3) are arranged (X-direction). The first, second and fourth moving mechanisms M1, M2, M4 cause the second hand 240 to move in the vertical direction (Z-direction) and the direction in which the openers 21a to 21d (FIG. 3) are arranged (X-direction).

Figure 5:
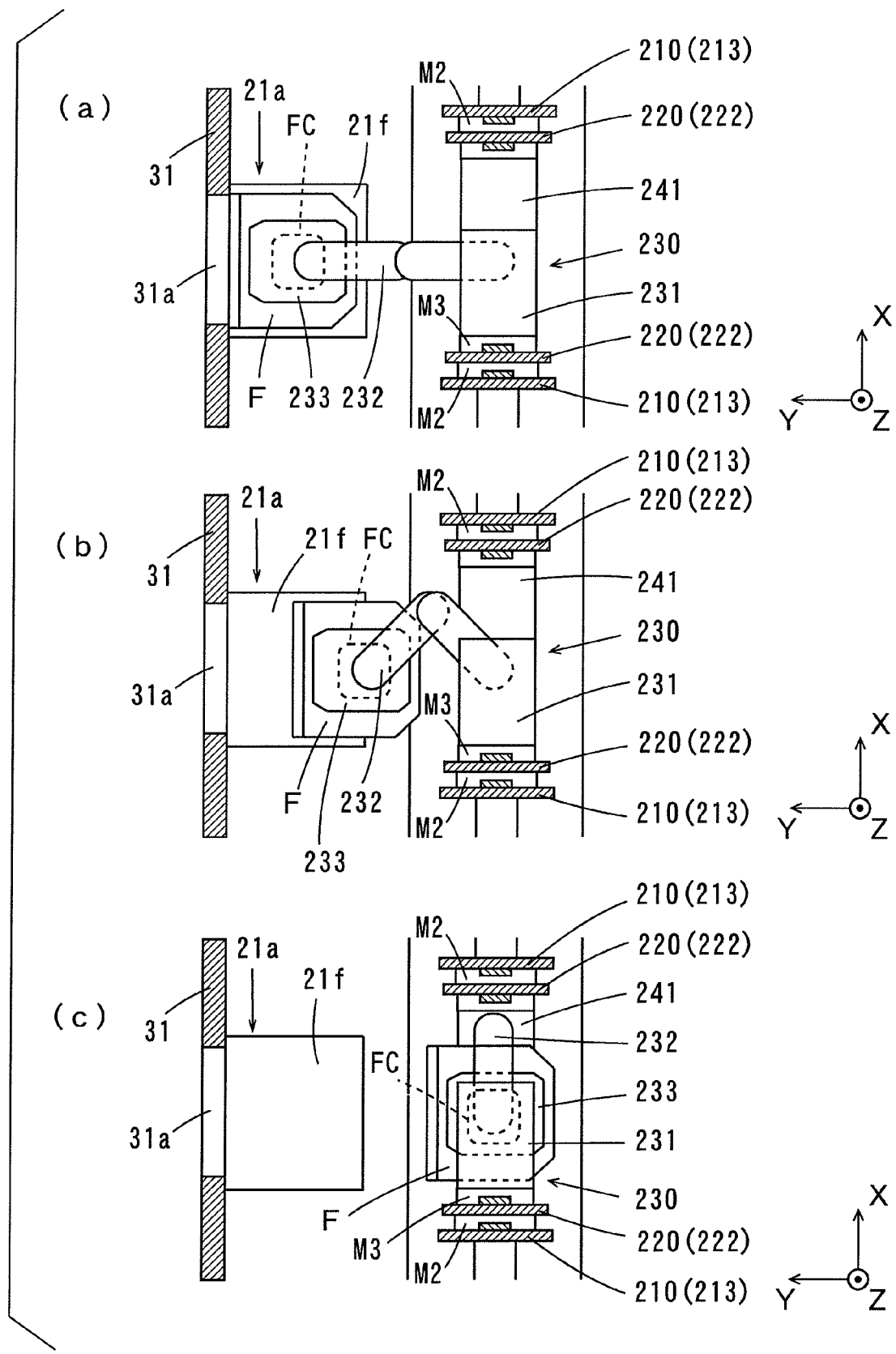
FIG. 5 is a transverse sectional view taken along the line D-D of FIG. 4 showing an operation of a first hand.

Description will be made of the first hand 230. FIG. 5 is a transverse sectional view taken along the line D-D of FIG. 4 showing an operation of the first hand 230. In the following description, before the operation of the first hand 230 is started, the carrier F is placed on the platform 21f of the opener 21a, and the first hand 230 is supported slightly above a position opposite to the opener 21a.

As shown in FIG. 5, in the first hand 230, one end of the multi-joint arm 232 is attached to a lower surface of the support plate 231 extending from the third moving mechanism M3. The grip portion 233 is attached to the other end of the multi-joint arm 232.

The multi-joint arm 232 extends/contracts in a front-to-rear direction (Y-direction) of the opener 21a. Thus, the grip portion 233 advances/retreats in the front-to-rear direction (Y-direction) of the opener 21a while being maintained in a horizontal attitude.

As shown in FIG. 5 (a), the multi-joint arm 232 extends with the carrier F placed on the platform 21f of the opener 21a, so that the grip portion 233 moves from the inside of the second transport frame 220 to a position of the projection FC of the carrier F. This causes the projection FC of the carrier F to be gripped by the grip portion 233.

In this state, the multi-joint arm 232 contracts to cause the grip portion 233 that grips the carrier F to move from the position above the opener 21a toward the second transport frame 220 as shown in FIG. 5 (b).

As shown in FIG. 5 (c), the multi-joint arm 232 contracts to the inside of the second transport frame 220 to cause the grip portion 233 that grips the carrier F to move into the second transport frame 220. This causes the carrier F to be held within the second transport frame 220.

While description is made of the operation of the first hand 230 when holding the carrier F that has been placed on the opener 21a in the second transport frame 220 in the foregoing paragraphs, the first hand 230 can move the carrier F held in the second transport frame 220 toward the opener 21a and place the carrier F on the platform 21f.

In this manner, the carrier F placed on the platforms 21f of the plurality of openers 21a, 21b, 21c, 21d, the receiving shelf 22a, the passing shelf 22b and the plurality of keeping shelves 22c, 22d, 22e, 22f of FIG. 2 can be held in the second transport frame 220 by using the first hand 230.

The carrier F held in the second transport frame 220 can be placed on the platforms 21f of the plurality of openers 21a, 21b, 21c, 21d, the receiving shelf 22a, the passing shelf 22b and the plurality of keeping shelves 22c, 22d, 22e, 22f of FIG. 2.

The configuration and operation of the second hand 240 are the same as those of the first hand 230.

(4) Exchange Operation of the Carriers by the Transport Device Included in the Storage Device As described above, in the storage device 2, when the carrier F placed on the platform 21f (FIGS. 2 and 3) of one of the openers 21a, 21b for taking out the substrates becomes empty, the carrier F is taken out from the platform 21f by the transport device 200 of FIG. 4, and another carrier F (carrier F storing the substrates W before processing) is placed on the platform 21f (the first carrier transporting step).

When the given number of substrates W after processing is stored in the carrier F placed on the platform 21f (FIGS. 2 and 3) of one of the openers 21c, 21d for storing the substrates, the carrier F is taken out from the platform 21f by the transport device 200 of FIG. 4, and another carrier F (empty carrier F) is placed on the platform 21f (the second carrier transporting step).

In this manner, the exchange operation of the carriers F is performed by the transport device 200 of FIG. 4 on the openers 21a to 21d. Description will be made of the exchange operation of the carriers F by the transport device 200 by referring to FIGS. 4 and 6 to 8.

Figure 6:
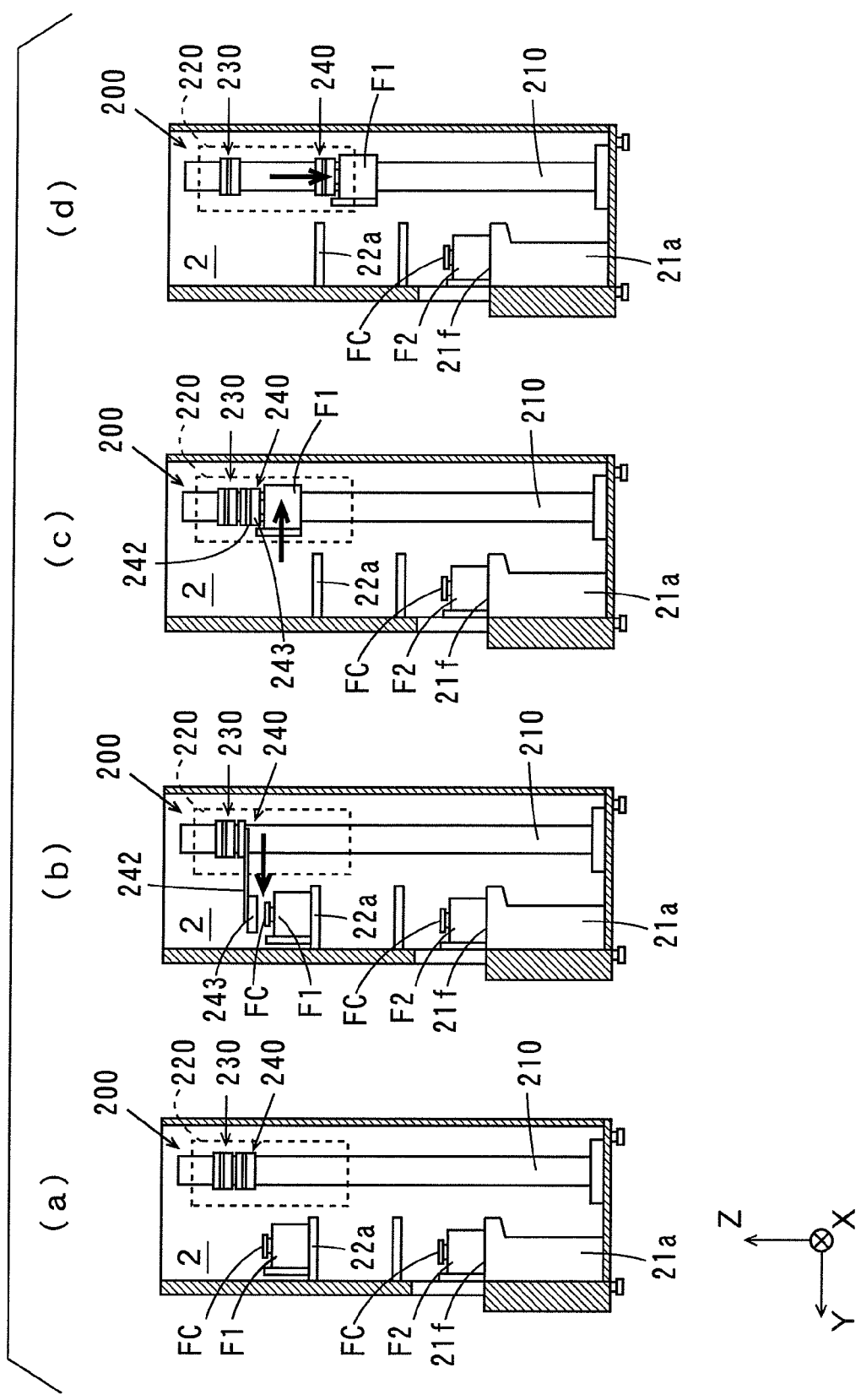
FIG. 6 is a schematic vertical sectional view for use in illustrating an exchange operation of carriers in a storage device.
Figure 7:
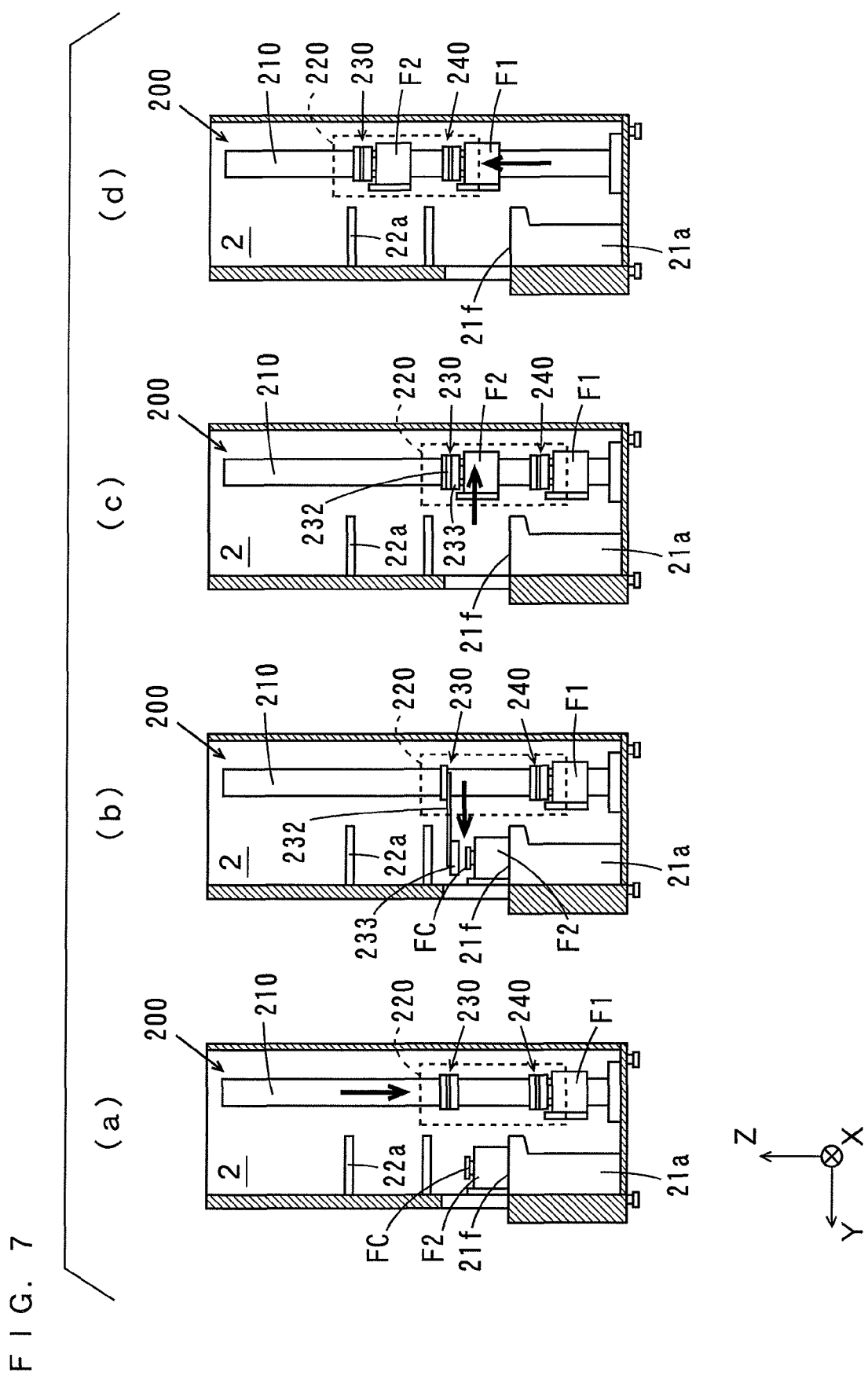
FIG. 7 is a schematic vertical sectional view for use in illustrating the exchange operation of the carriers in the storage device.
Figure 8:
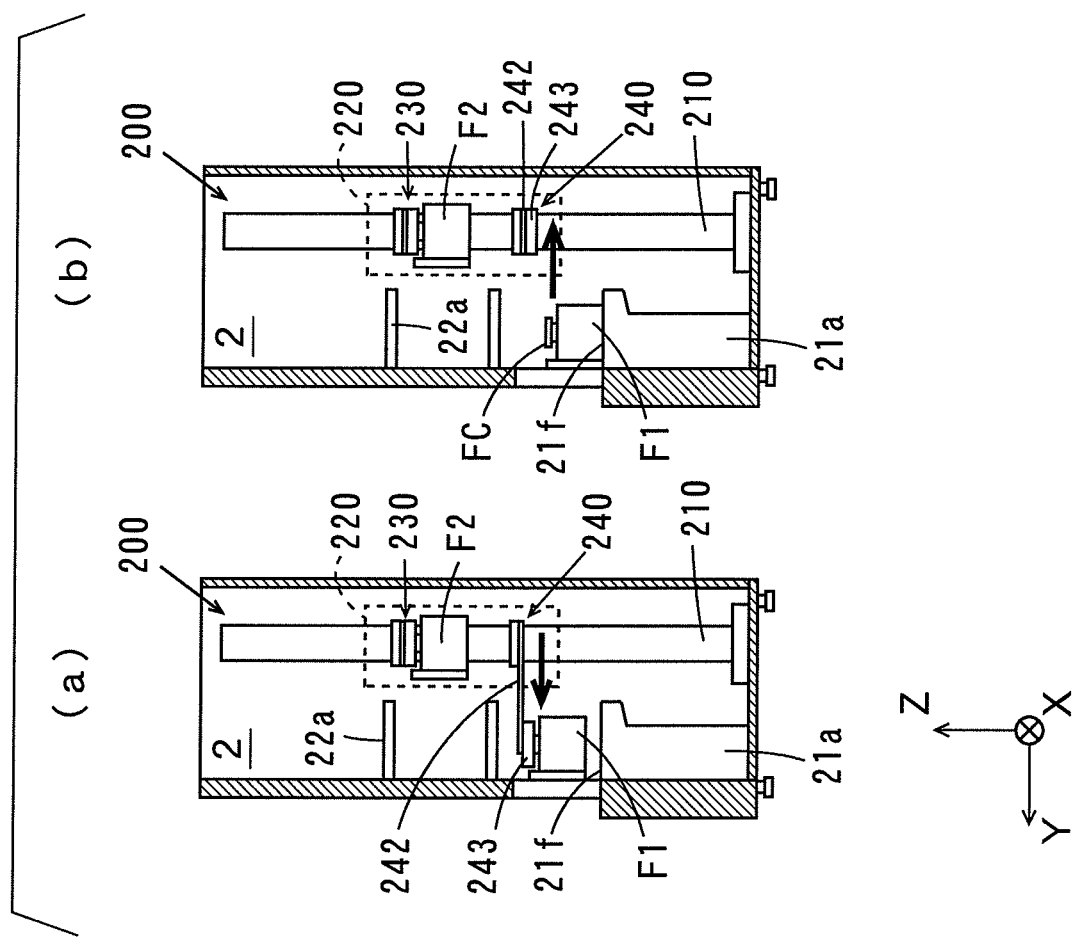
FIG. 8 is a schematic vertical sectional view for use in illustrating the exchange operation of the carriers in the storage device.

FIGS. 6 to 8 are schematic vertical sectional views for use in illustrating the exchange operation of the carriers F in the storage device 2. In the following paragraphs, description will be made of the operation of the transport device 200 when exchanging the empty carrier F2 for another carrier F1 storing the substrates W before processing on the platform 21f of the opener 21a in the first carrier transporting step.

As shown in FIG. 6 (a), the carrier F1 is placed on the receiving shelf 22a before the start of the first carrier transporting step. The first transport frame 210 moves to the direction in which the openers 21a to 21d are arranged (X-direction) and the second transport frame 220 moves in the vertical direction (Z-direction), so that the first and second hands 230, 240 are supported slightly above a position opposite to the receiving shelf 22a. At this time, the first and second hands 230, 240 are in close proximity to each other within the second transport frame 220.

As indicated by the arrow in FIG. 6 (b), when the first carrier transporting step is started, the multi-joint arm 242 of the second hand 240 extends to move the grip portion 243 to a position above the carrier F1 placed on the receiving shelf 22a. In this state, the second hand 240 is slightly lowered, so that the projection FC of the carrier F1 is gripped by the grip portion 243.

Next, as indicated by the arrow in FIG. 6 (c), the multi-joint arm 242 contracts to move the grip portion 243 that grips the carrier F1 into the second transport frame 220. This causes the carrier F1 to be held by the second hand 240 within the second transport frame 220.

The second hand 240 subsequently moves downward within the second transport frame 220 as indicated by the arrow in FIG. 6 (d). Thus, the first and second hands 230, 240 are separated a given distance from each other in the vertical direction (Z-direction) within the second transport frame 220. The given distance is larger than the height of the carrier F.

The second transport frame 220 then moves downward as indicated by the arrow in FIG. 7 (a). This causes the first hand 230 to be supported slightly above the position opposite to the opener 21a.

Next, the multi-joint arm 232 of the first hand 230 extends to cause the grip portion 233 to move to a position above the carrier F placed on the opener 21a as indicated by the arrow in FIG. 7 (b). In this state, the first hand 230 is slightly lowered, so that the projection FC of the carrier F2 is gripped by the grip portion 233.

The multi-joint arm 232 subsequently contracts to cause the grip portion 233 that grips the carrier F2 to move into the second transport frame 220 as indicated by the arrow in FIG. 7 (c). Thus, the carrier F2 is held by the first hand 230 within the second transport frame 220.

The second transport frame 220 then moves upward as indicated by the arrow in FIG. 7 (d). Thus, the second hand 240 that holds the carrier F1 is supported slightly above the position opposite to the opener 21a.

The multi-joint arm 242 of the second hand 240 extends to cause the grip portion 243 that grips the carrier F1 to move to the position above the opener 21a as indicated by the arrow in FIG. 8 (a). In this state, the first hand 230 is slightly lowered, so that the carrier F1 is placed on the platform 21f of the opener 21a. Then, a state where the projection FC is gripped by the grip portion 243 is released.

Next, the multi-joint arm 242 contracts to cause the grip portion 243 to move into the second transport frame 220 as indicated by the arrow in FIG. 8 (b). In this manner, the exchange operation of the carriers F1, F2 is performed on the platform 21f of the opener 21a. The empty carrier F2 held by the first hand 230 is transported to any of the other openers 21c, 21d (FIG. 2) and the keeping shelves 22d, 22e (FIG. 2) by the transport device 200. Accordingly, the first carrier transporting step is finished.

A series of operations shown in FIG. 6 (a) to (d) and FIG. 7 (a) is performed before the carrier F2 placed on the opener 21a becomes empty in the present embodiment. That is, the transport device 200 waits in the vicinity of the opener 21a while holding another carrier F1 before a time point where the carrier F2 placed on the opener 21a becomes ready to be exchanged (FIG. 7 (a)).

While description is made of the exchange operation of the carriers F on the opener 21a in the foregoing paragraphs, the exchange operation of the carriers F is performed in the same manner on the other openers 21b, 21c, 21d (FIG. 2) and the keeping shelves 22c to 22f (FIG. 2).

Therefore, when exchanging the carriers F on the opener 21b for taking out the substrates (FIG. 2), the transport device 200 waits in the vicinity of the opener 21b while holding another carrier F (a carrier F storing the substrates before processing) before the carrier F placed on the opener 21b becomes empty (before the time point where the carrier F becomes ready to be exchanged).

In addition, when exchanging the carriers F on the openers 21c, 21d for storing the substrates (FIG. 2), the transport device 200 waits in the vicinity of the openers 21c, 21d while holding another carrier F (an empty carrier F) before the given number of substrates W is stored in the carrier F placed on the openers 21c, 21d (before the time point where the carrier F becomes ready to be exchanged).

(5) Control System

Figure 9:
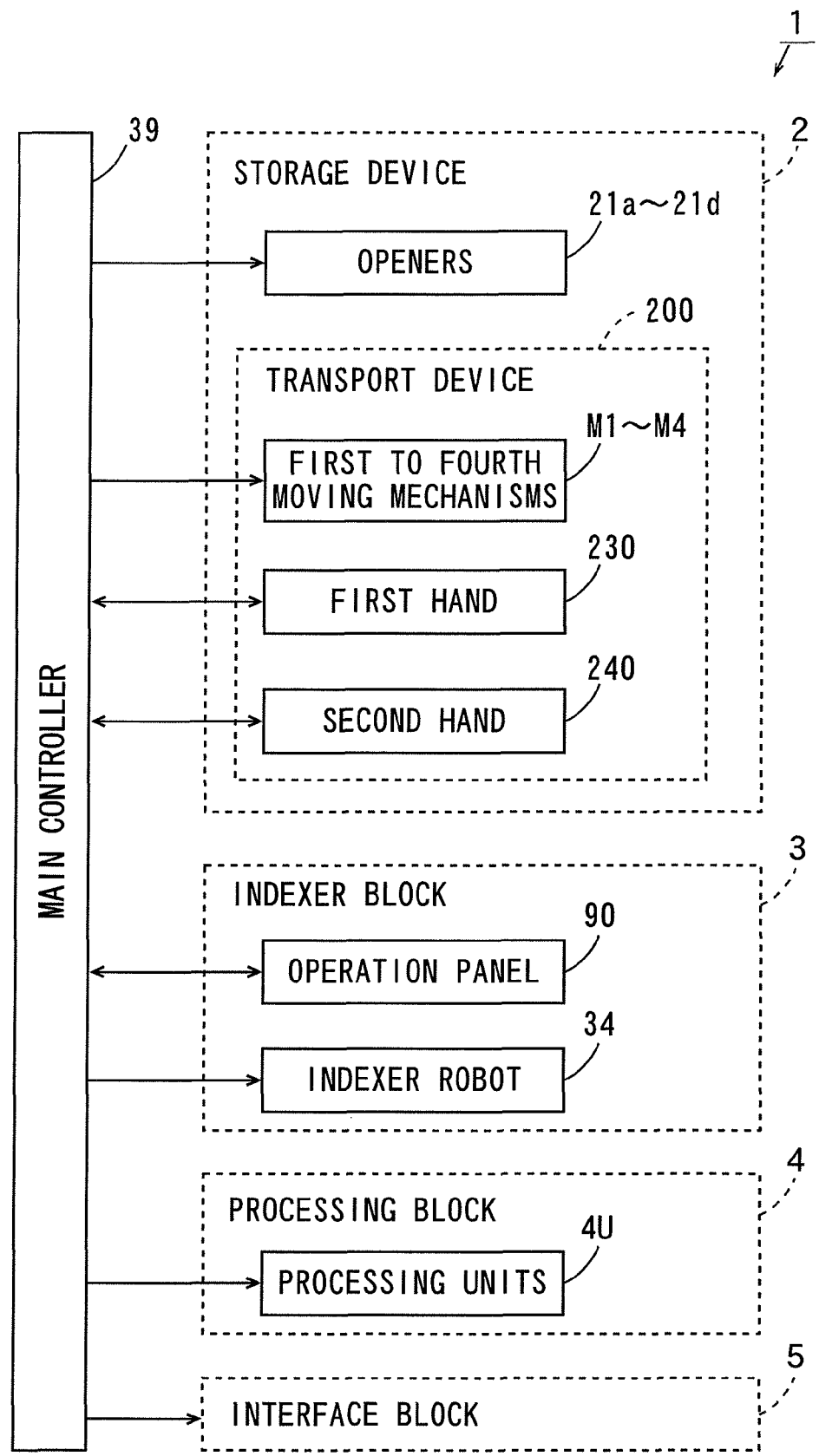
FIG. 9 is a block diagram showing a control system of the substrate processing apparatus according to the one embodiment of the present invention.

FIG. 9 is a block diagram showing a control system of the substrate processing apparatus 1 according to the one embodiment of the present invention. As shown in FIG. 9, the main controller 39 of FIG. 1 controls the operations of the components in the storage device 2, the indexer block 3, the processing block 4 and the interface block 5.

Thus, the operations of the openers 21a to 21d, the first to fourth moving mechanisms M1 to M4, the first and second hands 230, 240 of the storage device 2 are controlled by the main controller 39. The operation of the indexer robot 34 of the indexer block 3 is also controlled by the main controller 39. Furthermore, the alarm device 91 of the operation panel 90 in the indexer block 3 is controlled by the main controller 39. The operations of the processing units 4U of the processing block 4 are also controlled by the main controller 39.

Here, the first and second hands 230, 240 include encoders for operating the multi-joint arms 232, 242 of FIG. 4, respectively, as well as motors. Also, each of the first to fourth moving mechanisms M1 to M4 includes an encoder as well as a motor. A signal indicating an operation state of the motor (a rotation angle of the motor, for example) is output from the encoder to the main controller 39 in each of the first and second hands 230, 240 and the first to fourth moving mechanisms M1 to M4.

This allows the main controller 39 to determine whether or not an abnormality occurs in the first hand 230 based on the signals output from the encoders of the first hand 230 and the third moving mechanism M3.

For example, the main controller 39 can determine whether or not the first hand 230 is normal based on the signal output from the first hand 230 in response to a command to the first hand 230 and the signal output from the third moving mechanism M3 in response to a command to the third moving mechanism M3.

Similarly, the main controller 39 can determine whether or not the second hand 240 is normal based on the signals output from the encoders of the second hand 240 and the fourth moving mechanism M4.

Accordingly, when an abnormality occurs in any one of the first and second hands 230, 240, the main controller 39 can perform an exchange operation of the carriers F using only the other hand that is normal instead of performing the exchange operation of the carriers F shown in FIGS. 6 to 8.

In the following description, the way of operating the storage device 2 in which the exchange operation of the carriers F is performed using the first and second hands 230, 240 as shown in FIGS. 6 to 8 is referred to as a first operation mode. The way of operating the storage device 2 in which the exchange operation of the carriers F is performed using only one of the first and second hands 230, 240 is referred to as a second operation mode.

The exchange operation of the carriers F on the opener 21a in the second operation mode is performed as follows, for example. Suppose that the first hand 230 is normal and an abnormality occurs in the second hand 240.

When the carrier F on the opener 21a (FIG. 2) becomes empty, the first hand 230 holds the empty carrier F, and transports and places the carrier F on any of the other openers 21c, 21d (FIG. 2).

Next, the first hand 230 moves to the position of the receiving shelf 22a (FIG. 2), and holds the carrier F placed in advance on the receiving shelf 22a (the carrier F storing the substrates W before processing). The first hand 230 then transports and places the held carrier F on the opener 21a as the carrier F for exchange.

In this manner, the one hand that is normal transports the carrier F, which is to be exchanged, from an arbitrary opener to another opener, and moves to the shelf on which another carrier F for exchange is placed (the receiving shelf 22a, for example), and then transports the another carrier F placed on the shelf to the arbitrary opener, so that the exchange operation of the carriers F is performed in the second operation mode.

Figure 10:
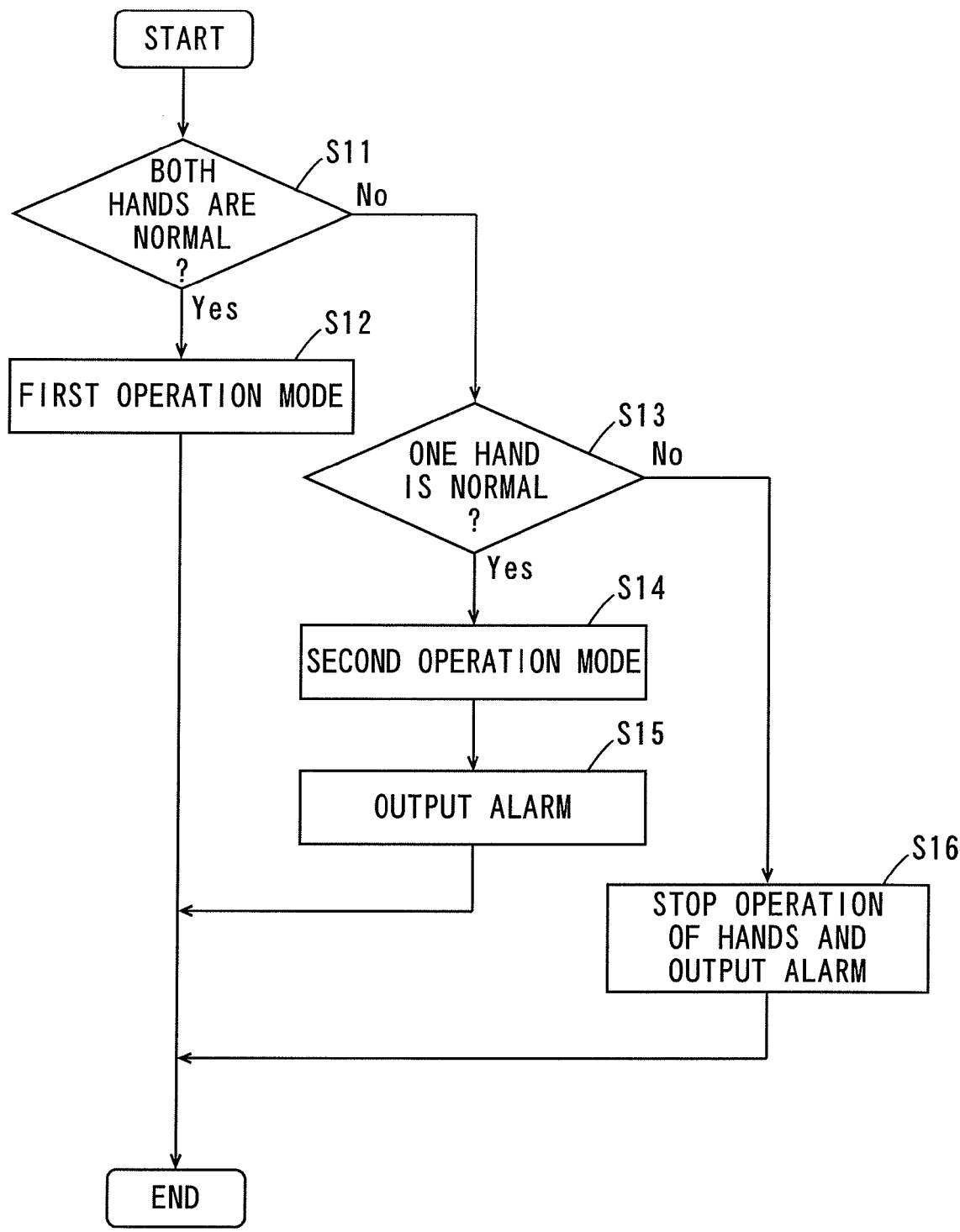
FIG. 10 is a flowchart showing one example of abnormality determination processing performed by a main controller.

FIG. 10 is a flowchart showing one example of abnormality determination processing by the main controller 39. As shown in FIG. 10, the main controller 39 first determines whether or not the first and second hands 230, 240 are normal (Step S11).

When the first and second hands 230, 240 are normal, the main controller 39 controls the components of the storage device 2 to perform the exchange operation of the carriers F in the first operation mode using the first and second hands 230, 240 (Step S12).

When at least one of the first and second hands 230, 240 is not normal, the main controller 39 determines whether or not any one of the first and second hands 230, 240 is normal (Step S13).

When any one of the first and second hands 230, 240 is normal, the main controller 39 controls the components of the storage device 2 to perform the exchange operation of the carriers F in the second operation mode using the normal hand (Step S14), and causes the alarm device 91 of FIG. 1 to output an alarm indicating an occurrence of an abnormality in one hand (Step S15).

When both the first and second hands 230, 240 are not normal, the main controller 39 stops the operations of the first and second hands 230, 240, and causes the alarm device 91 of FIG. 1 to output an alarm indicating an occurrence of abnormalities in both hands (Step S16).

The above-described abnormality determination processing is repeated in a given cycle during operation of the substrate processing apparatus 1. Thus, when an abnormality occurs in any one of the first and second hands 230, 240, the substrates W can be continued to be carried in and out using the normal hand. This prevents a significant drop in production efficiency of the substrate processing apparatus 1.

In Step S13, when any one of the first and second hands 230, 240 is normal, the main controller 39 may stop the operations of the first and second hands 230, 240 and cause the alarm device 91 of FIG. 1 to output the alarm indicating the occurrence of the abnormality in one hand instead of performing the processes of Steps S14, S15.

In this case, an operation unit (a switch or the like) for directing the operation in the second operation mode is provided in the operation panel 90 of FIGS. 2 and 3, for example. A worker operates the foregoing operation unit in the case of an output of the alarm, so that the storage device 2 can perform the exchange operation of the carriers F in the second operation mode using the normal hand.

(6) Effects (6-a) As described above, the transport device 200 includes the first and second hands 230, 240 in the storage device 2. In this case, when exchanging the carriers F on the openers 21a to 21d, the transport device 200 can hold the carrier F for exchange in advance using one hand before the time point where the placed carrier F becomes ready to be exchanged. Accordingly, when exchanging the carriers F, the transport device 200 can take out the carrier F from the opener using the other hand, and then quickly places the carrier F held by the one hand on the opener.

The second hand 240 is provided below the first hand 230 in the transport device 200. Thus, the transport device 200 can be made compact. This suppresses an increase in size of the substrate processing apparatus 1.

Providing the minimum number of openers improves throughput of substrate processing while suppressing an increase in size of the substrate processing apparatus 1.

(6-b) The first and second hands 230, 240 of the transport device 200 are provided in the second transport frame 220 via the third and fourth moving mechanisms M3, M4, respectively. The second transport frame 220 is provided in the first transport frame 210 via the second moving mechanisms M2.

Thus, the first and second hands 230, 240 can be moved in the vertical direction by the third and fourth moving mechanisms M3, M4 while the second transport frame 220 is moved in the vertical direction by the second moving mechanisms M2. This improves the moving speed of the first and second hands 230, 240 in the vertical direction. As a result, time for transporting the carriers F in the storage device 2 can be sufficiently shortened.

(6-c) The first and second hands 230, 240 of the transport device 200 can be independently moved in the vertical direction by the third and fourth moving mechanisms M3, M4, respectively. Since the first and second hands 230, 240 can move relative to each other, the first and second hands 230, 240 can be brought close to or separated from each other. Accordingly, the limited space in the vertical direction in the storage device 2 can be efficiently utilized.

Figure 11:
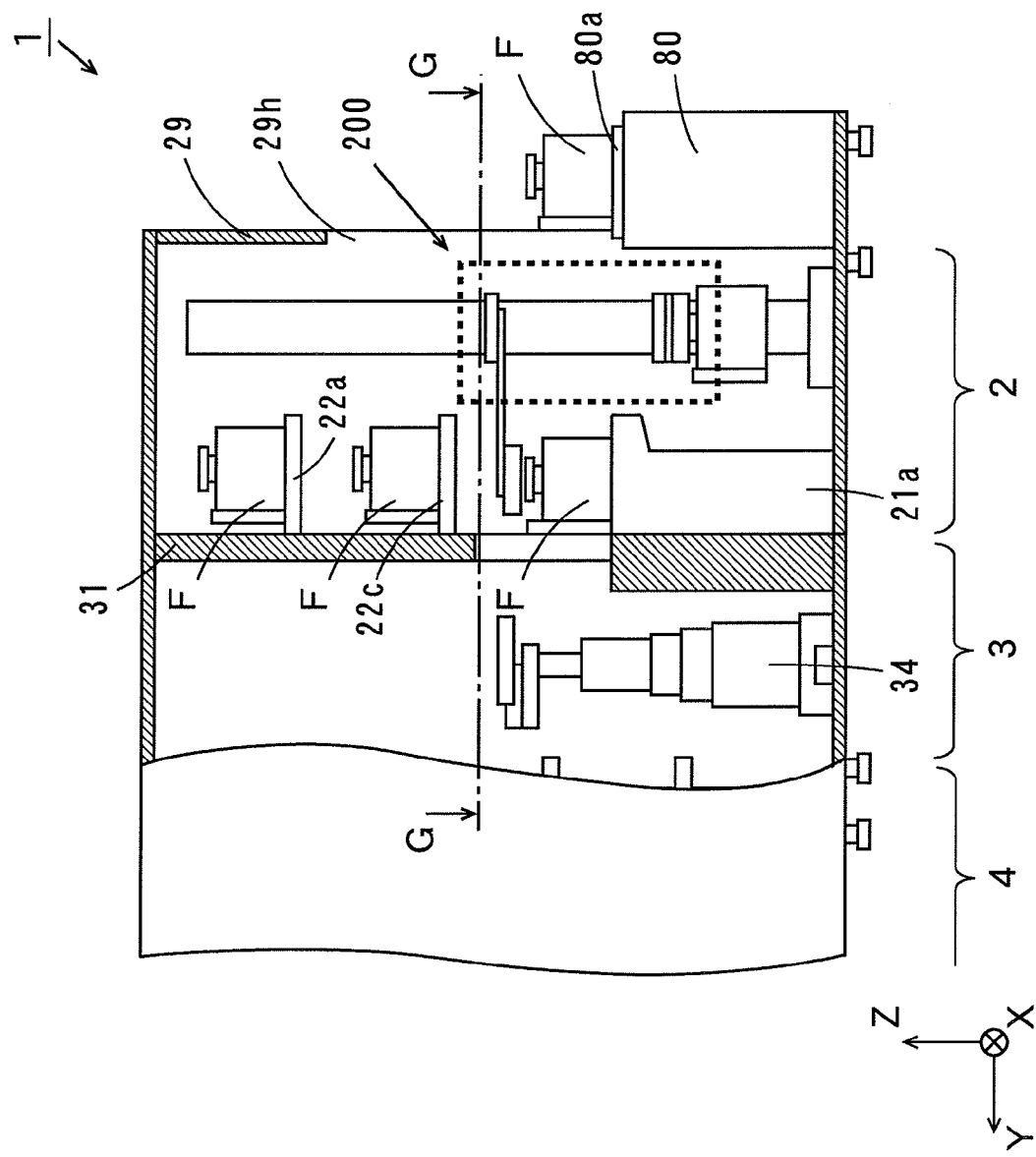
FIG. 11 is a partially cutaway sectional view of the storage device and an indexer block of a substrate processing apparatus according to another embodiment.
Figure 12:
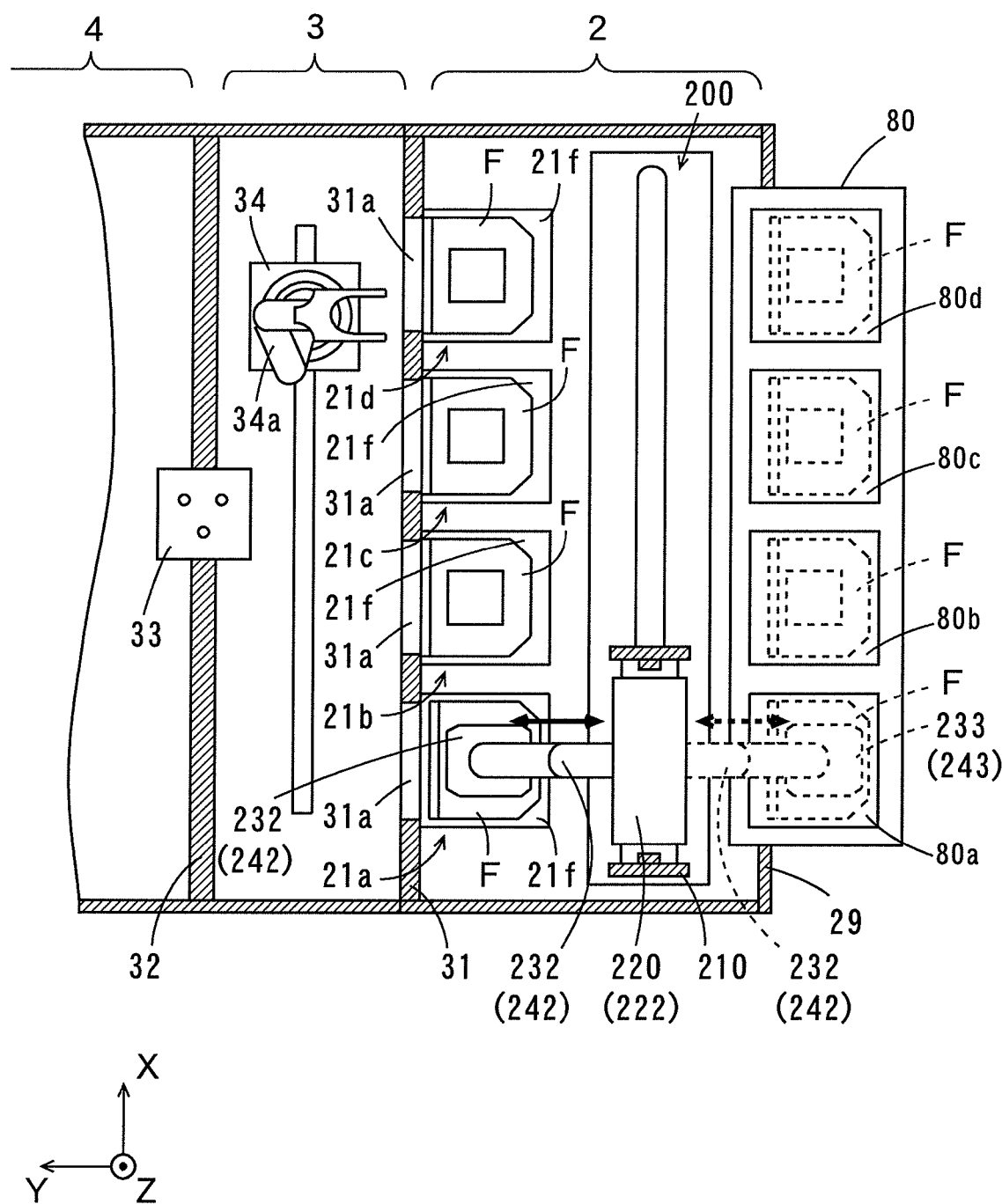
FIG. 12 is a transverse sectional view taken along the line G-G of FIG. 11.

(7) Other Embodiments (7-a) FIG. 11 is a partially cutaway sectional view of the storage device 2 and the indexer block 3 of the substrate processing apparatus 1 according to another embodiment. FIG. 12 is a transverse sectional view taken along the line G-G of FIG. 11. Description will be made of the substrate processing apparatus 1 of FIG. 11 by referring to differences from the substrate processing apparatus 1 of FIG. 1.

As shown in FIGS. 11 and 12, the upper portion of the storage device 2 is not opened, and an opening 29h is formed in a side wall 29 of the storage device 2 that is opposite to the partition wall 31 in the substrate processing apparatus 1.

A loading port 80 is provided in the opening 29h of the side wall 29 in the storage device 2. Four loading port platforms 80a, 80b, 80c, 80d are provided on an upper surface of the loading port 80.

The loading port platforms 80a, 80b, 80c, 80d (FIG. 12) are arranged to be opposite to the openers 21a, 21b, 21c, 21d (FIG. 12) with the transport device 200 therebetween. The height of each of the loading port platforms 80a to 80d is substantially equal to the height of each of the platforms 21f (FIG. 12) of the openers 21a to 21d.

Here, the multi-joint arms 232, 242 of the first and second hands 230, 240 of FIGS. 4 and 5 can extend/contract with respect to the openers 21a to 21d and the loading port platforms 80a to 80d through the inside of the second transport frame 220 as indicated by the thick solid arrow and the thick dotted arrow in FIG. 12.

The multi-joint arm 232 extends/contracts with respect to the openers 21a to 21d and the loading port platforms 80a to 80d, so that the carrier F can be moved in the front-to-rear direction (Y-direction) of the second transport frame 220 through the inside of the second transport frame 220.

At the time of carrying the carrier F in the substrate processing apparatus 1, the carrier F transported from the outside of the substrate processing apparatus 1 by the external transport device (not shown) is placed on one of the loading port platforms 80a, 80b. In this state, the first hand 230 or the second hand 240 of the transport device 200 advances/retreats to/from the loading port 80 (see the thick dotted arrow of FIG. 12). Accordingly, the carrier F placed on the one of the loading port platforms 80a, 80b is held by the first hand 230 or the second hand 240, and carried in the substrate processing apparatus 1.

At the time of carrying the carrier F from the substrate processing apparatus 1 to the outside, the given number of substrates W after processing is stored in the carrier F placed on one of the openers 21c, 21d, so that the first transport frame 210 of the transport device 200 moves to a position opposite to the one of the openers 21c, 21d. In this state, the first hand 230 or the second hand 240 of the transport device 200 advances/retreats to/from the one of the openers 21c, 21d (see the thick solid arrow of FIG. 12). Accordingly, the carrier F placed on the one of the openers 21c, 21d is held by the first hand 230 or the second hand 240.

The held carrier F is transported to the loading port 80 through the inside of the transport device 200 (the inside of the second transport frame 220 of FIG. 4) by the first hand 230 or the second hand 240, and placed on any of the loading port platforms 80c, 80d. The carrier F placed on the one of the loading port platforms 80c, 80d is carried out to the outside of the substrate processing apparatus 1 by the external transporting device.

As described above, the height of each of the loading port platforms 80a to 80d is substantially equal to the height of each of the platforms 21f of openers 21a to 21d. This eliminates the need to move the carrier F in the vertical direction (Z-direction) when the carrier F is transported between the loading port platforms 80a to 80d and the openers 21a to 21d. As a result, the transport path of the carrier F by the transport device 200 is shortened, and the time for transporting the carrier F in the storage device 2 is shortened.

(7-b) While the transport device 200 of the storage device 2 includes the first and second hands 230, 240 in the foregoing embodiments, the present invention is not limited to this. The transport device 200 may include a larger number of hands.

Figure 13:
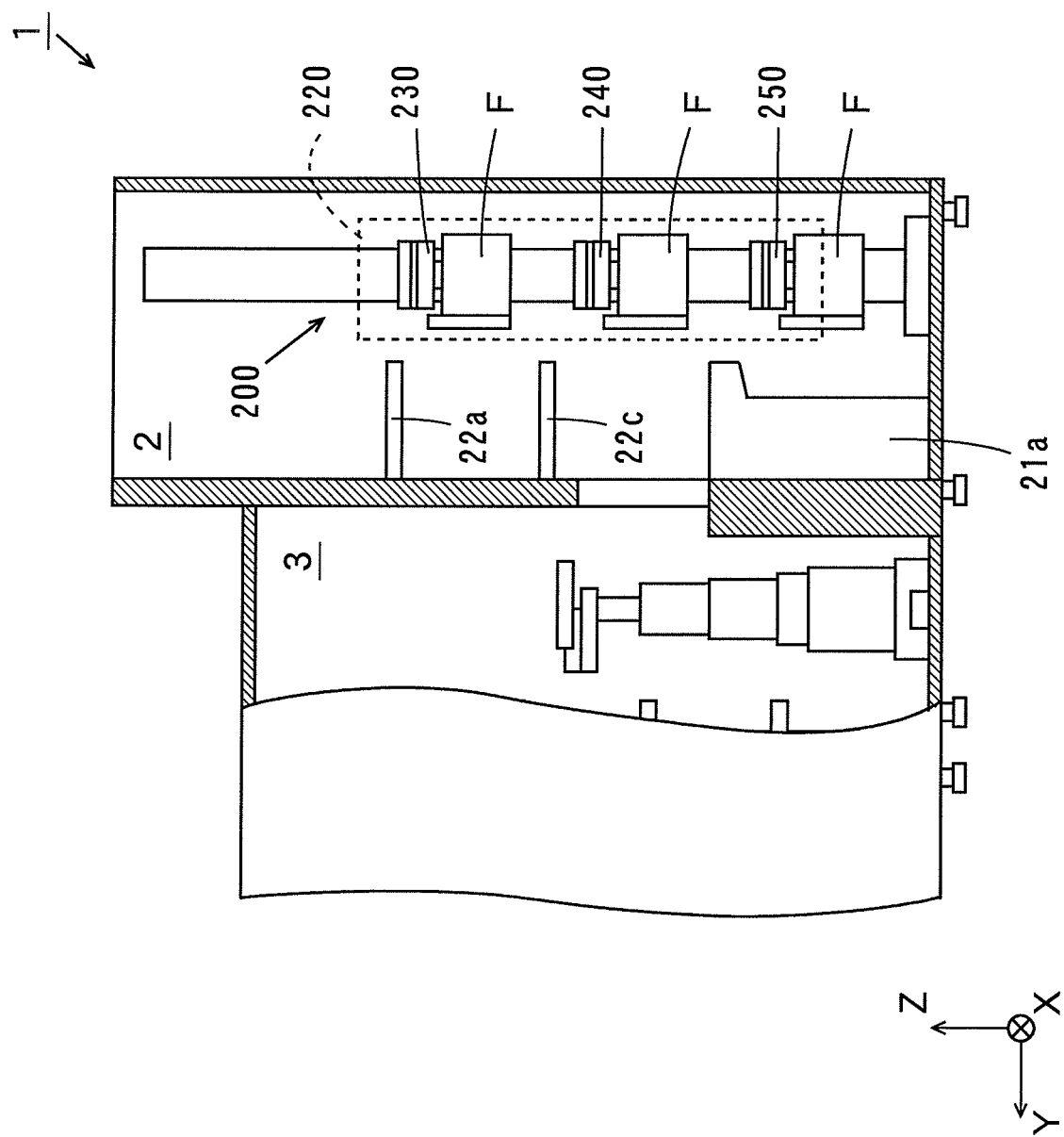
FIG. 13 is a diagram for use in illustrating a transport device including three hands.

FIG. 13 is a diagram for use in illustrating a transport device 200 including three hands. In FIG. 13, a third hand 250 in addition to the first and second hands 230, 240 is provided in the second transport frame 220 of the transport device 200.

In this case, another carrier F can be held by the other hand even during the exchange operation of the carriers F using the two hands. Accordingly, when the carrier F cannot be placed on any of the plurality of openers 21a to 21d, the receiving shelf 22a, the passing shelf 22b and the keeping shelves 22c to 22f, for example, at least one carrier F can be held by the other hand in the second transport frame 220.

When the exchange operation of the carriers F is sequentially performed in two adjacent openers, for example, carriers F for exchange (other carriers F) for the respective openers are held in advance by the two hands.

In this case, the exchange operation of the carriers F is performed using the hand not holding the carrier F and one hand holding the carrier F on one opener, and the transport device 200 then moves to a position of the other opener. Then, the exchange operation of the carriers F using the hand not holding the carrier F and the other hand holding the carrier F can be performed on the other opener. As a result, the transport paths of the plurality of carriers F by the transport device 200 are shortened, and the time for transporting the carriers F in the storage device 2 is further shortened.

(7-c) While the first and second hands 230, 240 of the transport device 200 are provided in the second transport frame 220 via the third and fourth moving mechanisms M3, M4, respectively, in the above-described embodiment, the present invention is not limited to this. The first and second hands 230, 240 may be provided in the first transport frame 210 via the third and fourth moving mechanisms M3, M4, respectively.

In this case, the second transport frame 220 is not required, resulting in a simplified configuration of the transport device 200.

While the first hand 230 and the second hand 240 are configured to move on the different rails 220R in the above-described embodiment, the first hand 230 and the second hand 240 may be configured to move on a common rail.

(7-d) While the substrates W are taken out from the carriers F on the openers 21a, 21b, and the substrates W are stored in the carriers F on the openers 21c, 21d in the foregoing embodiments, the present invention is not limited to this. The substrates W may be taken out from the carriers F and stored in the carriers F on all the openers 21a to 21d.

In this case, the carriers F storing the substrates W before processing are placed on the openers 21a to 21d, and the substrates W before processing are taken out from the placed carriers F by the indexer robot 34 of FIGS. 1 and 3. After all the substrates W before processing are taken out from the carriers F and the carriers F become empty, the substrates W after processing are stored in the empty carriers F by the indexer robot 34. Then, the carriers F storing the given number of substrates W after processing are taken out from the openers 21a to 21d.

(7-e) While description is made of the example in which the main controller 39 that controls the components of the storage device 2 is provided in the indexer block 3 in the above-described embodiment, the present invention is not limited to this. The main controller 39 may be provided in the storage device 2.

A slave controller that controls the components of the storage device 2 may be provided in the storage device 2. Accordingly, the storage device 2 can be easily applied to the existing substrate processing apparatus 1. In this case, the slave controller of the storage device 2 is controlled by the main controller 39.

(7-f) While description is made of the example in which the coating processing unit for resist film, the thermal processing unit and the development processing unit are included in the processing units 4U in the above-described embodiment, the present invention is not limited to this.

The processing units 4U may include a washing processing unit that washes the surface of the substrate W. The processing unit 4U may include a coating processing unit for anti-reflection film that forms an anti-reflection film on the surface of the substrate W, and may include a coating processing unit for protection film that forms various protection films for protecting the surface of the substrate W.

(7-g) While description is made of the example in which the FOUP is used as the carrier F in the above-described embodiments, the present invention is not limited to this. SMIF (Standard Mechanical Interface) pods and OCs (Open Cassettes) that hold and expose the stored substrate to outside air can be also used.

(8) Correspondences Between Elements in the Claims and Parts in Embodiments

In the following paragraphs, non-limiting examples of correspondences between various elements recited in the claims below and those described above with respect to various preferred embodiments of the present invention are explained.

In the foregoing embodiments, the carrier F is an example of a substrate storing container, the indexer block 3, the processing block 4 and the interface block 5 are an example of a main body, the platforms 21f of the openers 21a to 21d, the receiving shelf 22a, the passing shelf 22b, and the plurality of keeping shelves 22c to 22f are examples of a plurality of platforms.

The first hand 230 is an example of a first holder, the second hand 240 is an example of a second holder, the first transport frame 210, the rail 200R and the first moving mechanism M1 are an example of a horizontal moving mechanism.

The first transport frame 210, the second transport frame 220, the pair of rails 210R, the pair of rails 220R and the second to fourth moving mechanisms M2 to M4 are an example of a vertical moving mechanism.

The second transport frame 220 is an example of a support body, the second moving mechanisms M2 are an example of a support body vertical moving mechanism, one of the pair of rails 220R and the third moving mechanism M3 are an example of a first holder moving mechanism, the other one of the pair of rails 220R and the fourth moving mechanism M4 are an example of a second holder moving mechanism, the side plates 222 used in a pair are examples of first and second support members, respectively, and the main controller 39 is an example of a controller.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. A substrate processing apparatus arranged to perform given processing on substrates, comprising:
   a storage device in and from which a substrate storing container storing a plurality of substrates is carried;
   a main body arranged to take out the substrates from said substrate storing container carried in said storage device, perform the given processing on the taken out substrates, and store the substrates after the processing in said substrate storing container carried in said storage device; and
   a controller arranged to control an operation of said storage device, wherein
   said storage device includes:
   a plurality of platforms on one of which said substrate storing container is to be placed; and
   a transport device arranged to transport said substrate storing container among said plurality of platforms,
   said transport device includes first and second holders configured to be able to hold said substrate storing container and move among said plurality of platforms, wherein
   said second holder is provided below said first holder,
   said first and second holders are configured to be capable of moving independently from each other along a common axis extending in a vertical direction,
   said controller controls said transport device, with one substrate storing container placed on any one of said platforms, to hold another substrate storing container using one of said first and second holders and cause said another substrate storing container to wait in a position opposite to said one platform, and when said one substrate storing container placed on said one platform is ready to be transported, to hold and take out said one substrate storing container from said one platform using the other one of said first and second holders and place said another substrate storing container on said one platform using said one holder, and
   said controller determines whether or not an abnormality occurs in said first or second holder, and controls said transport device, when the abnormality occurs in one of said first and second holders, to stop an operation of said one holder, and to use said other holder to place said substrate storing container on said one of said platforms, to take said substrate storing container out from said one of said platforms, and to transport said substrate storing container among said plurality of platforms.

2. A storage device comprising:
   a plurality of platforms on which a substrate storing container that can store a plurality of substrates is to be placed; and
   a transport device arranged to transport said substrate storing container among said plurality of platforms, wherein
   said transport device includes:
   first and second holders configured to be able to hold said substrate storing container and move among said plurality of platforms; and
   a controller, wherein
   said second holder is provided below said first holder,
   said first and second holders are configured to be capable of moving independently from each other along a common axis extending in a vertical direction,
   said controller controls said transport device, with one substrate storing container placed on any one of said platforms, to hold another substrate storing container using one of said first and second holders and cause said another substrate storing container to wait in a position opposite to said one platform, and when said one substrate storing container placed on said one platform is ready to be transported, to hold and take out said one substrate storing container from said one platform using the other one of said first and second holders and place said another substrate storing container on said one platform using said one holder, and
   said controller determines whether or not an abnormality occurs in said first or second holder, and controls said transport device, when the abnormality occurs in one of said first and second holders, to stop an operation of said one holder, and to use said other holder to place said substrate storing container on said one of said platforms, to take said substrate storing container out from said one of said platforms, and to transport said substrate storing container among said plurality of platforms.

* * * * *